(12) United States Patent
Kawakubo et al.

(10) Patent No.: US 7,719,169 B2
(45) Date of Patent: May 18, 2010

(54) MICRO-ELECTROMECHANICAL DEVICE

(75) Inventors: Takashi Kawakubo, Yokohama (JP);
Toshihiko Nagano, Kawasaki (JP);
Michihiko Nishigaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 362 days.

(21) Appl. No.: 11/686,731

(22) Filed: Mar. 15, 2007

(65) Prior Publication Data

US 2008/0074006 A1  Mar. 27, 2008

(30) Foreign Application Priority Data

Sep. 22, 2006  (JP)  ............................. P2006-257816

(51) Int. Cl.
*H01L 41/04* (2006.01)
*H01L 41/047* (2006.01)
(52) U.S. Cl. ...................................... 310/332; 310/365
(58) Field of Classification Search ................. 310/324, 310/330–332, 365, 366
See application file for complete search history.

(56) References Cited

U.S. PATENT DOCUMENTS

2005/0194867 A1* 9/2005 Kawakubo et al. .......... 310/348
2006/0055287 A1* 3/2006 Kawakubo et al. .......... 310/348
2006/0067840 A1   3/2006 Kawakubo et al.
2006/0285255 A1  12/2006 Kawakubo et al.
2007/0228887 A1  10/2007 Nishigaki et al.
2008/0042521 A1   2/2008 Kawakubo et al.
2008/0061916 A1*  3/2008 Pulskamp ................... 336/130

FOREIGN PATENT DOCUMENTS

JP       07-124103     5/1995
WO      2005-059933    6/2005

OTHER PUBLICATIONS

Japanese Office Action dated Sep. 9, 2008 corresponding to U.S. Appl. No. 11/686,731, filed Mar. 15, 2007.

* cited by examiner

*Primary Examiner*—Walter Benson
*Assistant Examiner*—Derek J Rosenau
(74) *Attorney, Agent, or Firm*—Turocy & Watson, LLP

(57) ABSTRACT

A micro-electromechanical device includes a first piezoelectric actuator and a second piezoelectric actuator. The first piezoelectric actuator includes a first beam fixed on a substrate and a second beam extended in parallel to the first beam from a first connecting end to a first working end. A second piezoelectric actuator includes a third beam, spaced from the first beam, fixed on the substrate and a fourth beam extended in parallel to the third beam from a second connecting end to a second working end. The second working end faces the first working end in a perpendicular direction to a surface of the substrate.

2 Claims, 31 Drawing Sheets

MICRO-ELECTROMECHANICAL DEVICE

CROSS REFERENCE TO RELATED APPLICATIONS AND INCORPORATION BY REFERENCE

This application is based upon and claims the benefit of priority from prior Japanese patent application P2006-257816 filed on Sep. 22, 2006; the entire contents of which are incorporated by reference herein.

BACKGROUND OF THE INVENTION

1. Field of the Invention

The present invention relates to a micro-electromechanical device using a piezoelectric actuator.

2. Description of the Related Art

Recently, an actuator fabricated by micro-electromechanical system (MEMS) technology has attracted attention. In such an actuator, a beam of the actuator is bent and displaced by a driving force, such as an electrostatic force, a thermal stress, an electromagnetic force, and a piezoelectric force.

Micro-electromechanical devices, such as variable capacitors and switches, which use an actuator, have been proposed. A variable capacitor or switch fabricated by MEMS technology includes a movable electrode provided on a beam of the actuator having an end suspended over the free space on a substrate, and a fixed electrode provided on a surface of the substrate. The movable electrode and the fixed electrode face each other in a direction perpendicular to a surface of the substrate. The actuator is bent so as to vary in distance between the movable electrode and the fixed electrode.

In particular, in a MEMS variable capacitor having a piezoelectric actuator which uses an inverse piezoelectric effect or an electrostrictive effect as a driving force, a movable beam of the piezoelectric actuator may continuously and widely vary an interval between a movable electrode and a fixed electrode. Accordingly, a capacitance variation of the MEMS variable capacitor may increase. Moreover, since air or gas between the movable electrode and the fixed electrode are used as a dielectric, the MEMS variable capacitor advantageously has an extremely large Q value and the like.

Moreover, the structure of a MEMS variable capacitor may also be applicable to a MEMS switch. For example, in a capacitive type switch, a movable electrode is capacitively coupled with a fixed electrode across an extremely thin dielectric film. Alternatively, in a DC contact type switch, a movable electrode is brought into direct contact with a fixed electrode. Such a switch fabricated by MEMS technology has also attracted attention, since the switch has both a low on-state resistance and a high isolation capability in an off-state.

A piezoelectric actuator has a long and thin beam including a piezoelectric film sandwiched by top and bottom electrodes. The beam is suspended over the free space on a substrate by fixing an end of the beam on a substrate. Therefore, it is a serious problem that the beam is vertically warped due to as light residual stress in a material of the piezoelectric film. Hence, it is extremely difficult to adjust a capacitance value with an applied voltage to a MEMS variable capacitor as designed, or to set a drive voltage of a MEMS switch at a steady value.

For example, at an operation end in which the movable electrode is provided in the piezoelectric actuator, a displacement D of the beam due to the electrostrictive effect is approximated by the following expression:

$$D \sim E \cdot d_{31} \cdot L^2 \cdot t^{-1} \tag{1}$$

where E is an electric field applied to the piezoelectric film, $d_{31}$ is a piezoelectric strain coefficient of the piezoelectric film, and L and t are a length and thickness of the actuator, respectively.

A warpage Dw of the piezoelectric actuator, which is caused by a residual stress Sr occurring on the deposited piezoelectric film and the like, is approximated by the following expression:

$$Dw \sim Sr \cdot L^2 \cdot t^{-1} \tag{2}$$

As understood from a comparison between expression (1) and expression (2), both of the displacement D and the warpage Dw have a similar relation regarding the length L and the thickness t of the piezoelectric actuator. Specifically, the displacement D and the warpage Dw are proportional to a square of length L, and are inversely proportional to the thickness t. For example, in order to increase a drive range of the piezoelectric actuator, it is effective to increase the length L or to decrease the thickness t. In response, the displacement D may be increased, but also the warpage Dw is increased. Hence, in order to increase the drive range of the piezoelectric actuator while suppressing the warpage, geometrical modification for the actuator may have almost no effect. There will be no other way but to reduce an absolute value of the residual stress Sr compared to an absolute value of the piezoelectric strain ($E \cdot d_{31}$) due to the electrostrictive effect.

With respect to lead zirconate titanate (PZT) that is a piezoelectric material having a large electrostrictive effect, it is necessary to anneal a PZT film at about 600 C. after the PZT film is deposited at room temperature in order to obtain a good film quality. A contraction in volume may occur due to such annealing. Accordingly, a residual stress of the PZT piezoelectric film is inevitably increased. In addition, for a piezoelectric film, such as aluminum nitride (AlN), zinc oxide (ZnO), and the like, which can be deposited at around room temperature with a good film quality, it is possible to relatively precisely control residual stress by adjusting deposition conditions. However, an electrostrictive effect in the piezoelectric film, such as AlN, ZnO, and the like, is smaller than the PZT film by a factor of ten or more.

In the case of using a piezoelectric material having such a large electrostrictive effect in order to increase the piezoelectric strain of the piezoelectric film of the piezoelectric actuator, it is difficult to control residual stress in a piezoelectric film, and to suppress warpage of the actuator. Moreover, a piezoelectric material, in which the residual stress can be controlled relatively easily, has a small electrostrictive effect. In such piezoelectric material, a drive range of the actuator cannot be sufficiently increased in comparison with the warpage of the actuator. Due to the problems as described above, technological application of the piezoelectric actuator is precluded. The piezoelectric actuator is strongly warped by the slight residual stress due to a serious problem relating to such a structure of the piezoelectric actuator, that is, the thin and long beam structure. Therefore, it is difficult to fabricate a MEMS variable capacitor with a constant capacitance, or a MEMS switch with a constant operation voltage.

The present inventors have proposed an actuator having a folded beam structure, as a measure for reducing warpage due to a residual stress of a piezoelectric actuator (refer to Japanese Patent Laid-Open Application No. 2006-87231). A piezoelectric actuator having a folded beam structure includes first and second beams. This structure is obtained by folding the second beam, which is substantially identical in shape and dimension to the first beam, with respect to a first beam that is fixed at a fixed end. A working end of the second beam is placed adjacent to the fixed end. In this way, the warpage of the first beam may be cancelled by the warpage of the second beam. Moreover, by applying a drive voltage to either one of the first and second beams, or by applying opposite drive voltages to each of the first and second beams, a drive displacement due to the piezoelectric action is not be canceled. Thus, a sufficient drive range may be ensured.

Based on the proposal of the inventors, design trials of the piezoelectric actuator have been performed. As a result, it has been proved that, although the warpage in a longitudinal direction in which the beams are extended is very effectively cancelled, the warpage caused by the distance in a lateral direction in which the fixed end and the working end face each other still exists. The warpage in the lateral direction depends on a ratio between a length and a width of the piezoelectric actuator. However, in so far as the trials, the warpage in the lateral direction is about 10% of the maximal warpage at the folded point of the piezoelectric actuator.

The warpage in the lateral direction of the piezoelectric actuator is nearly equal to the drive range of the piezoelectric actuator. Therefore, it is difficult to control the displacement accurately and repeatedly, with the piezoelectric drive. In this way, the warpage in the lateral direction, due to the residual stress of the piezoelectric actuator, decreases the manufacture yield and performance of a micro-electromechanical device using the piezoelectric actuator.

SUMMARY OF THE INVENTION

It is an object of the present invention to provide a micro-electromechanical device having a piezoelectric actuator which is capable of controlling displacement, with high accuracy and reproducibility, by suppressing warpage due to residual stress in a piezoelectric film.

An aspect of the present invention inheres a micro-electromechanical device including a first piezoelectric actuator including a first beam and a second beam, the second beam extending parallel to the first beam, a first fixed end positioned at an end of the first beam, a first connecting end positioned at another end of the first beam, a first working end positioned at an end of the second beam opposite to the first connecting end where another end of the second beam is located, the first fixed end fixed on a substrate; and a second piezoelectric actuator including a third beam spaced from the first beam and a fourth beam extending parallel to the third beam, a second fixed end positioned at an end of the third beam, a second connecting end positioned at another end of the third beam, a second working end positioned at an end of the fourth beam opposite to the second connecting end where another end of the fourth beam is located, the second fixed end fixed on the substrate, the second working end facing the first working end in a perpendicular direction to a surface of the substrate.

DETAILED DESCRIPTION OF THE INVENTION

Figure 1:
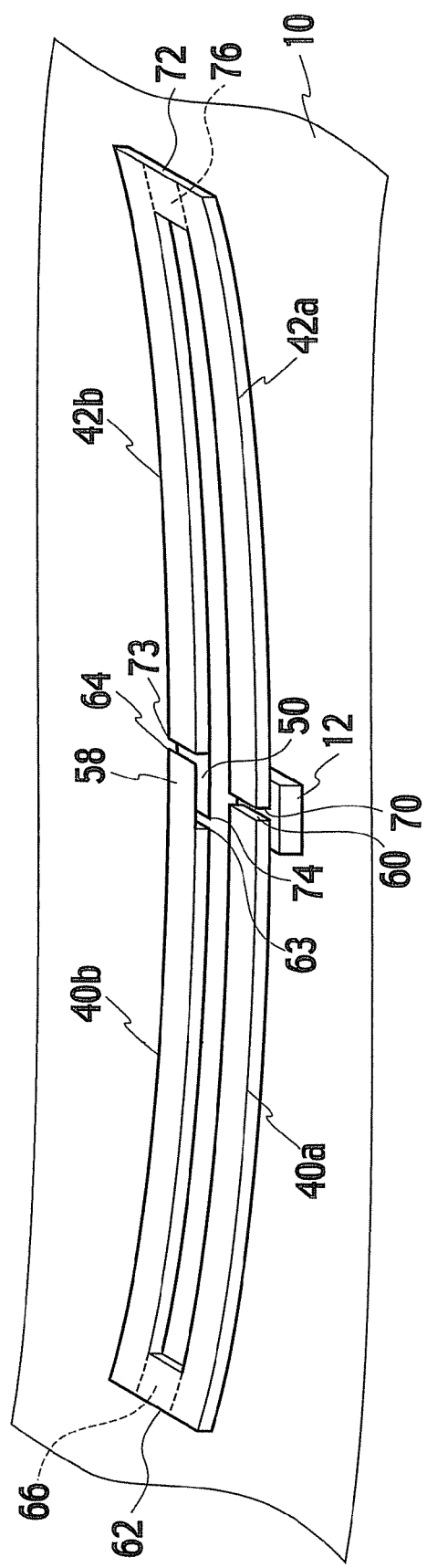
FIG. 1 is a perspective view showing an example of a micro-electromechanical device according to an embodiment of the present invention.

Various embodiments of the present invention will be described with reference to the accompanying drawings. It is to be noted that the same or similar reference numerals are applied to the same or similar parts and devices throughout the drawings, and the description of the same or similar parts and devices will be omitted or simplified.

A micro-electromechanical device according to an embodiment of the present invention includes a first piezoelectric actuator (40a, 40b) and a second piezoelectric actuator (42a, 42b), as shown in FIG. 1. The first piezoelectric actuator (40a, 40b) includes a first beam 40a and a second beam 40b. The second piezoelectric actuator (42a, 42b) includes a third beam 42a and a fourth beam 42b.

The first beam 40a is fixed to an anchor 12 on a substrate 10. The first beam 40a has a first fixed end 60 and a first connecting end 62 at another end of the first beam 40a. The first connecting end 62 is suspended over a free space on the substrate 10.

The second beam 40b extends from the first connecting end 62 in parallel to the first beam 40a. The second beam 40b has a first working end 64 opposite to the first connecting end 62. The first working end of the second beam 40b is suspended over the free space on the substrate 10.

The third beam 42a is fixed to the anchor 12 on the substrate 10. The third beam 42a has a second fixed end 70, spaced from the first fixed end of the first beam 40a at an end of the third beam 42a, and a second connecting end 72 at another end of the third beam 42a. The second connecting end 72 is suspended over the free space on the substrate 10.

The fourth beam 42b extends from the second connecting end 72 in parallel to the third beam 42a. The fourth beam 42b has a second working end 74 at an end of the fourth beam 42b opposite to another end of to the second connecting end 72. The second working end of the fourth beam 42b is suspended over the free space on the substrate 10.

The first and second fixed ends 60, 70 are disposed so as to face each other on a plane, parallel to a surface of the substrate 10, on the anchor 12. The first beam 40a and the third beam 42a extend along the same line. The direction toward the second connecting end 72 from the second fixed end 70 and the direction toward the first connecting end 62 from the first fixed end 60 are different from each other. A first working portion 58 provided between the first working end 64 and a first movable end 63 faces a second working portion 50 provided between the second working end 74 and a second movable end 73 in a direction perpendicular to the surface of the substrate 10.

Figure 2:
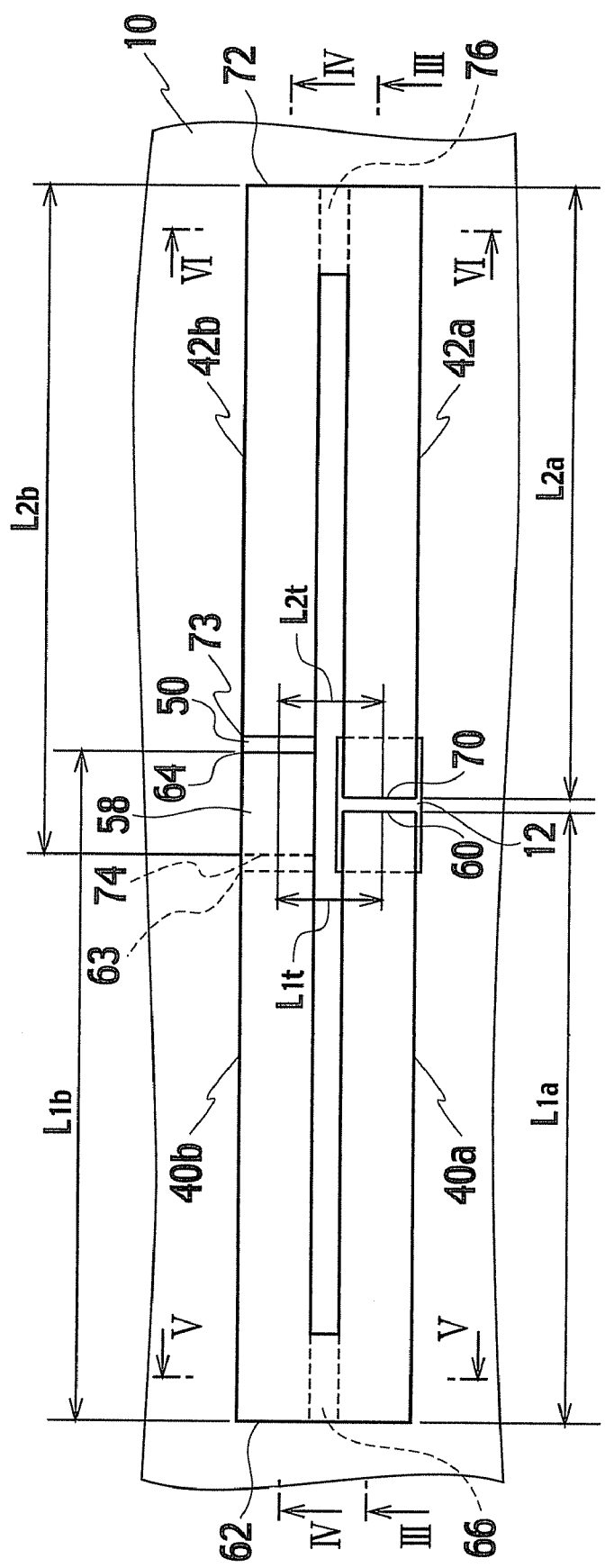
FIG. 2 is a schematic plan view showing an example of the micro-electromechanical device according to the embodiment of the present invention.

As shown in FIG. 2, the first and second beams 40a, 40b are connected through a first connecting portion 66 at the second connecting end 62. The third and fourth beams 42a, 42b are connected through a second connecting portion 76 at the second connecting end 72.

The beam length L1a of the first beam 40a is a distance from the first fixed end 60 to the first connecting end 62. The beam length L1b of the second beam 40b is a distance from the first connecting end 62 to the first working end 64. The beam length L2a of the third beam 42a is a distance from the second fixed end 70 to the second connecting end 72. The beam length L2b of the fourth beam 42b is a distance from the second connecting end 72 to the second working end 74. A beam interval L1t between the first and second beams 40a, 40b is defined as a distance between the centers of the first fixed end 60 and the first working end 64. A beam interval L2t between the third and fourth beams 42a, 42b is defined as a distance between the centers of the second fixed end 70 and the second working end 74.

The first and second piezoelectric actuators (40a, 40b), (42a, 42b) are disposed in a mirror symmetry with respect to the first and second fixed ends 60, 70 and are substantially equal in shape, with the exception of the first and second working ends 64, 74 which face each other. The beam lengths L1a, L2a are substantially equal, and the beam lengths L1b, L2b are substantially equal. Also, the beam intervals L1t, L2t are substantially equal. The beam intervals L1t and L2t are shorter than the beam lengths L1a, L1b, L2a and L2b.

Usually, in the first and second piezoelectric actuators (40a, 40b), (42a, 42b), warpage due to residual stress occurs, as shown in FIG. 1. In order to simplify the explanation, the warpage is omitted in drawings, such as cross sectional views of the piezoelectric actuator.

Figure 3:
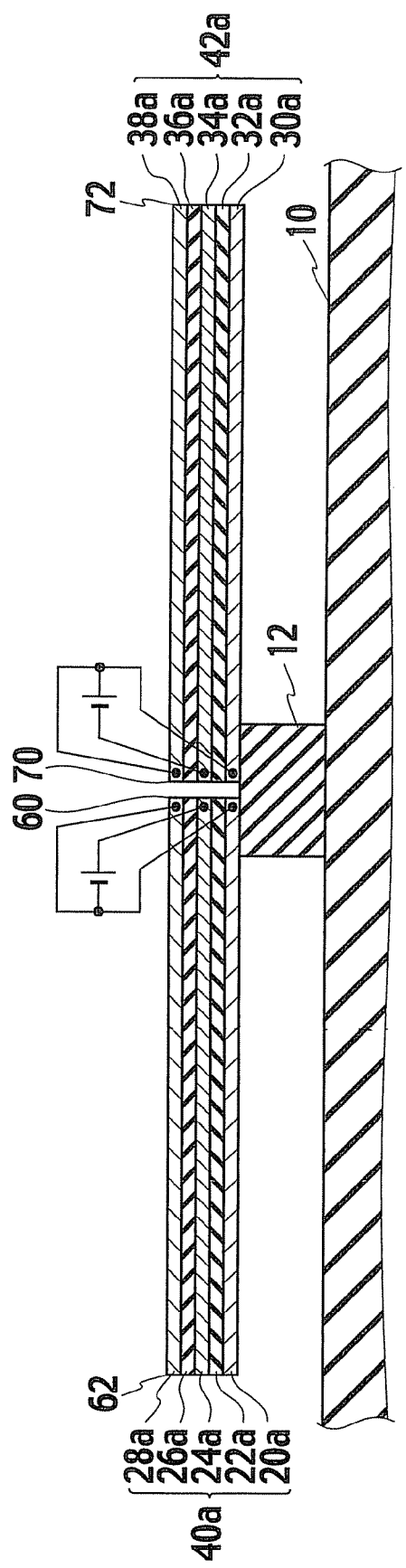
FIG. 3 is a schematic view showing an example of a cross section along a line III-III in the micro-electromechanical device of FIG. 2.
Figure 4:
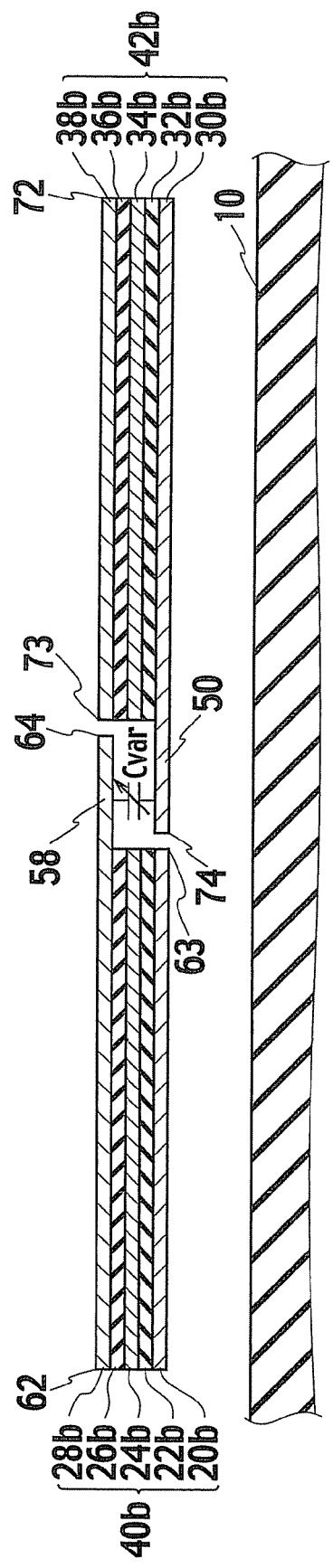
FIG. 4 is a schematic view showing an example of a cross section along a line IV-IV in the micro-electromechanical device of FIG. 2.

As shown in FIGS. 3 and 4, each of the first to fourth beams 40a, 40b, 42a, 42b has a bimorph structure. In the first piezoelectric actuators (40a, 40b), the first beam 40a is a drive beam, and the second beam 40b is a movable beam. In the second piezoelectric actuators (42a, 42b), the third beam 42a is a drive beam, and the fourth beam 42b is a movable beam.

The first beam 40a includes a first bottom electrode 20a, a first bottom piezoelectric film 22a on the first bottom electrode 20a, a first intermediate electrode 24a on the first bottom piezoelectric film 22a, a first top piezoelectric film 26a on the first intermediate electrode 24a, and a first top electrode 28a on the first top piezoelectric film 26a. The second beam 40b includes a second bottom electrode 20b, a second bottom piezoelectric film 22b on the second bottom electrode 20b, a second intermediate electrode 24b on the second bottom piezoelectric film 22b, a second top piezoelectric film 26b on the second intermediate electrode 24b, and a second top electrode 28b on the second top piezoelectric film 26b.

The third beam 42a includes a third bottom electrode 30a, a third bottom piezoelectric film 32a on the third bottom electrode 30a, a third intermediate electrode 34a on the third bottom piezoelectric film 32a, a third top piezoelectric film 36a on the third intermediate electrode 34a, and a third top electrode 38a on the third top piezoelectric film 36a. The fourth beam 42b includes a fourth bottom electrode 30b, a fourth bottom piezoelectric film 32b on the fourth bottom electrode 30b, a fourth intermediate electrode 34b on the fourth bottom piezoelectric film 32b, a fourth top piezoelectric film 36b on the fourth intermediate electrode 34b, and a fourth top electrode 38b on the fourth top piezoelectric film 36b.

Figure 5:
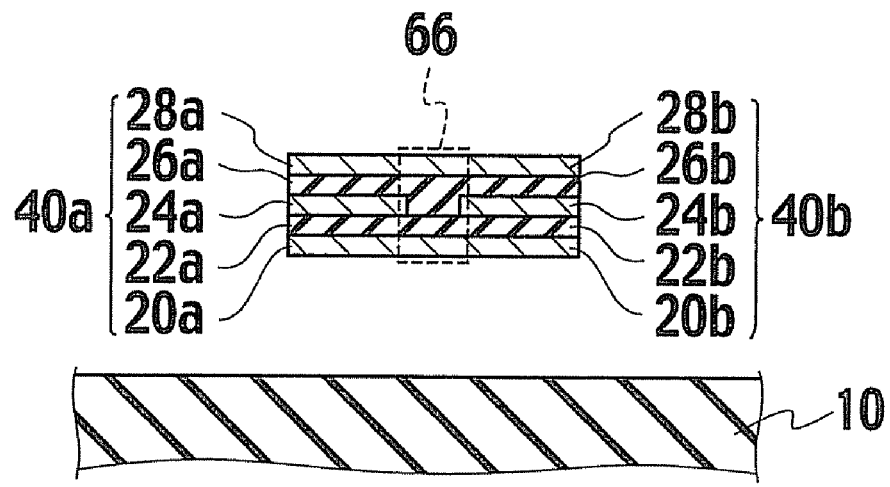
FIG. 5 is a schematic view showing an example of a cross section along a line V-V in the micro-electromechanical device of FIG. 2.
Figure 6:
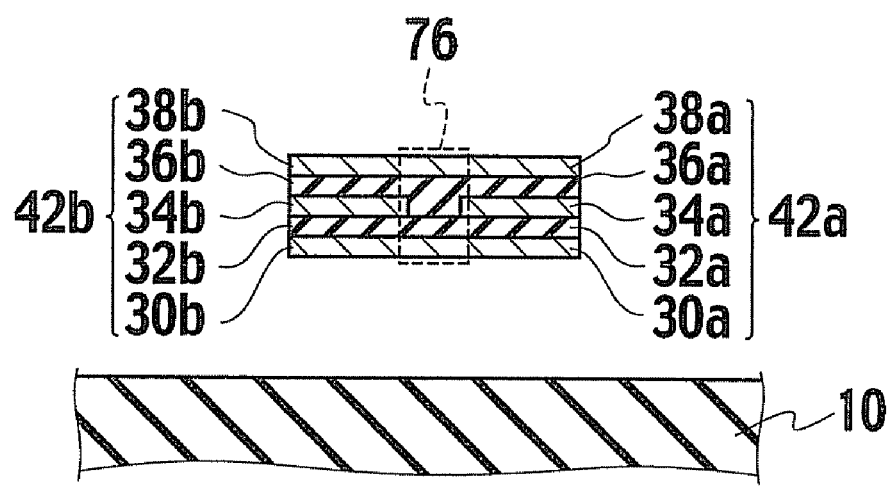
FIG. 6 is a schematic view showing an example of a cross section along a line VI-VI in the micro-electromechanical device of FIG. 2.

As shown in FIG. 5, the first and second bottom electrodes 20a, 20b of the first and second beams 40a, 40b, the first and second bottom piezoelectric films 22a, 22b, the first and second top piezoelectric films 26a, 26b, and the first and second top electrodes 28a, 28b are connected through the first connecting portion 66, respectively. Also, as shown in FIG. 6, the third and fourth bottom electrodes 30a, 30b of the third and fourth beams 42a, 42b, the third and fourth bottom piezoelectric films 32a, 32b, the third and fourth top piezoelectric films 36a, 36b, and the third and fourth top electrodes 38a, 38b are connected through the second connecting portion 76, respectively.

The first and second bottom piezoelectric films 22a, 22b, the first and second top piezoelectric films 26a, 26b, the third and fourth bottom piezoelectric films 32a, 32b and the third and fourth top piezoelectric films 36a, 36b are formed by the continuous piezoelectric layers, respectively. The first to fourth bottom piezoelectric films 22a, 22b, 32a and 32b and the first to fourth top piezoelectric films 26a, 26b, 36a and 36b have the same polarization direction.

Figure 7:
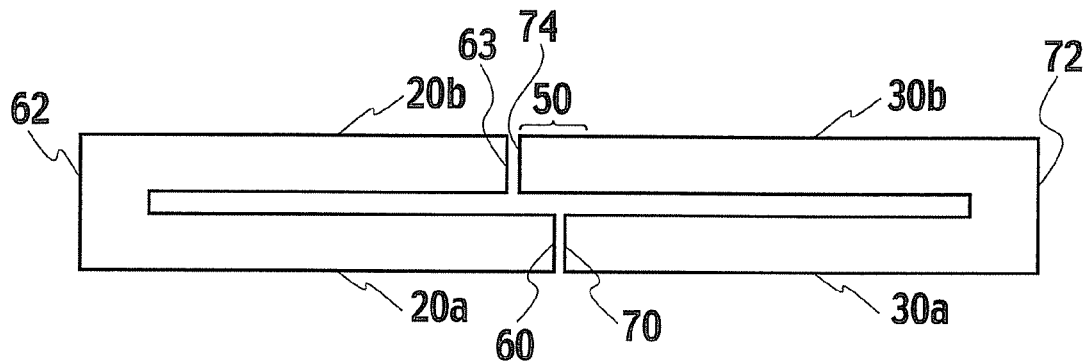
FIG. 7 is a schematic plan view showing an example of bottom electrodes of the micro-electromechanical device according to the embodiment of the present invention.

As shown in FIG. 7, the first and third bottom electrodes 20a, 30a are positioned such that the first and second fixed ends 60, 70 face each other. The second and fourth bottom electrodes 20b, 30b are positioned such that the first movable end 63 and the second working end 74 face each other. The second working portion 50 is provided at the second working end 74 of the fourth bottom electrode 30b. The second bottom electrode 20b connected to the first bottom electrode 20a at the first connecting end 62 is shorter than the first bottom electrode 20a. The fourth bottom electrode 30b connected to the third bottom electrode 30a at the second connecting end 72 is longer than the third bottom electrode 30a.

Figure 8:
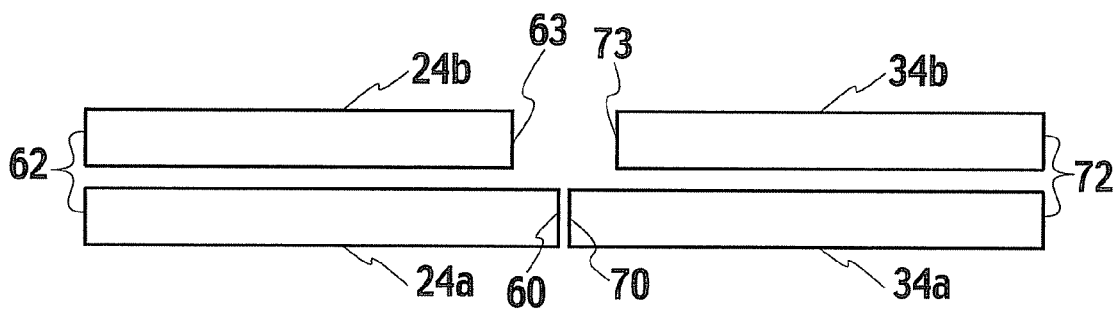
FIG. 8 is a schematic plan view showing an example of intermediate electrodes of the micro-electromechanical device according to the embodiment of the present invention.

As shown in FIG. 8, the first and third intermediate electrodes 24a, 34a are positioned such that first and second fixed ends 60, 70 face each other. The second and fourth intermediate electrodes 24b, 34b are positioned such that the first movable end 63 and the second movable end 73 face each other. The first and second intermediate electrodes 24a, 24b are separated so as to be electrically isolated from each other. The second intermediate electrode 24b is shorter than the first intermediate electrode 24a. The third and fourth intermediate electrodes 34a, 34b are separated so as to be electrically isolated. The fourth intermediate electrode 34b is shorter than the third intermediate electrode 34a.

Figure 9:
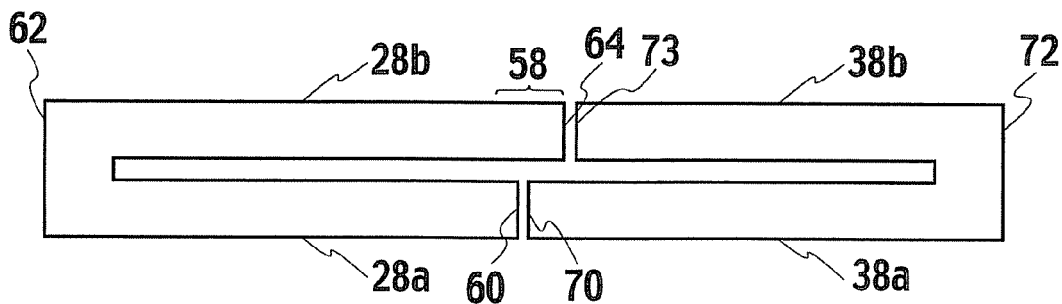
FIG. 9 is a schematic plan view showing an example of top electrodes of the micro-electromechanical device according to the embodiment of the present invention.

As shown in FIG. 9, the first and third top electrodes 28a, 38a are positioned such that the first and second fixed ends 60, 70 face each other. The second and fourth top electrodes 28b, 38b are positioned such that the first working end 64 and the second movable end 73 face each other. The first working portion 58 is provided at the first working end 64 of the second top electrode 28b. The second top electrode 28b connected to the first top electrode 28a at the first connecting end 62 is longer than the first top electrode 28a. The fourth top electrode 38b connected to the third top electrode 38a at the second connecting end 72 is shorter than the third top electrode 38a.

As for the substrate 10, an insulating glass substrate, a semiconductor substrate such as silicon (Si), and the like may be used. For the anchor 12, an insulating film, such as silicon oxide ($SiO_2$), silicon nitride ($Si_3N_4$), may be used. Additionally, for the first to fourth bottom electrodes 20a, 20b, 30a and 30b, the first to fourth intermediate electrodes 24a, 24b, 34a and 34b, the first to fourth top electrodes 28a, 28b, 38a and 38b and the like, a metal, such as aluminum (Al), gold (Au), platinum (Pt), copper (Cu), iridium (Ir), tungsten (W), and molybdenum (Mo), which has a low resistance and can be easily processed, may be desirably used. Furthermore, a wurtzite crystal, such as AlN and ZnO, may be desirable as a piezoelectric material for the first to fourth bottom piezoelectric films 22a, 22b, 32a, 32b and the first to fourth top piezoelectric films 26a, 26b, 36a, 36b, because the wurtzite crystal is stable. Furthermore, a perovskite ferroelectric material, such as PZT and barium titanate (BTO), is also usable.

When the micro-electromechanical device according to this embodiment of the present invention is used as a variable capacitor, a capacitor Cvar between the first and second working portions 58, 50 is used, as shown in FIG. 4. Capacitance of the capacitor Cvar changes in response to a change in distance between the first and second working portions 58, 50.

Usually, warpage due to residual stress caused in the deposition process occurs in the piezoelectric actuator. As shown in expression (2), the warpage of the piezoelectric actuator, which results from the residual stress is proportional to a square of the length of the actuator. In a three dimensional view, the piezoelectric actuator warps along a parabola taking the fixed portion as a center, with respect to the substrate 10.

In the embodiment of the present invention, as shown in FIGS. 1 and 2, the first and second piezoelectric actuators (40a, 40b), (42a, 42b) are constructed by the first and second beams 40a, 40b and the third and fourth beams 42a, 42b, respectively, using a folded structure. As a result, the first fixed end 60 and the first working end 64, and the second fixed end 70 and the second working end 74 can be located adjacent to each other, respectively. The first to fourth beams 40a, 40b, 42a, 42b individually warp in proportion to each square of the beam lengths L1a, L1b, L2a, L2b. However, the beam intervals L1t, L2t are shorter than the beam lengths L1a, L1b, L2a, L2b. Thus, it is possible to reduce the warpages of the first and second working ends 64, 74 resulting from the residual stress.

Moreover, the first to fourth beams 40a, 40b, 42a, 42b have a laminated structure similar to each other. Hence, even if a vertically asymmetric residual stress occurs in the laminated structure, the warpages of the first and third beams 40a, 42a is cancelled by the warpages of the second and fourth beams 40b, 42b folded from the first and third beams 40a, 42a, respectively. As a result, it is possible to decrease, to a certain degree, the displacement due to the warpage occurring in each of the first and second working ends 64, 74 against the first and second fixed ends 60, 70.

Moreover, the first and second piezoelectric actuators (40a, 40b), (42a, 42b) have substantially symmetrical shapes and the same dimensions. For this reason, warpage in a width direction of the piezoelectric actuator occurring in response to each of the beam intervals L1t, L2t is also substantially equal for each of the first and second piezoelectric actuators (40a, 40b), (42a, 42b). As a result, the interval between the first working portion 58 of the first working end 64 and the second working portion 50 of the second working end 74 may be kept constant regardless of any influence due to warpage.

Figure 10:
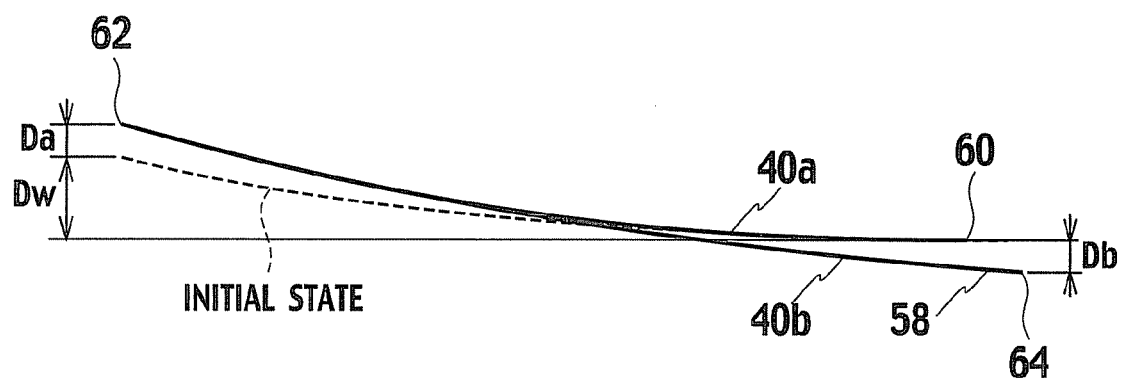
FIG. 10 is a schematic view showing an example of a piezoelectric drive of the first piezoelectric actuator of the micro-electromechanical device according to the embodiment of the present invention.
Figure 11:
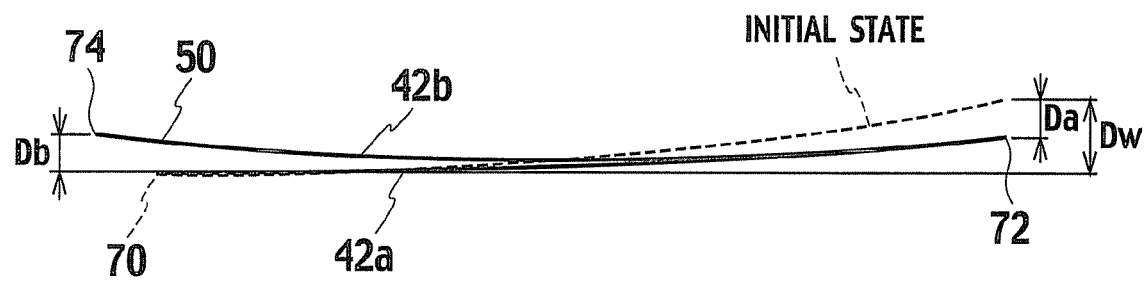
FIG. 11 is a schematic view showing an example of a piezoelectric drive of the second piezoelectric actuator of the micro-electromechanical device according to the embodiment of the present invention.

For example, as shown in FIGS. 10 and 11, the first and second beams 40a, 40b are displaced upward in a parabolic shape with a warpage Dw in the initial state where the drive voltage is not applied. The third and fourth beams 42a, 42b are also displaced upward in a parabolic shape with the warpage Dw in the initial state where the drive voltage is not applied. In the initial state, the first and second working ends 64, 74 are located at substantially the same height from the first and second fixed ends 60, 70.

As shown in FIG. 3, in the first piezoelectric actuator (40a, 40b), by applying a common potential to the first intermediate electrode 24a of the first beam 40a, a negative drive voltage is applied to the first bottom electrode 20a and the first top electrode 28a. In the second piezoelectric actuators (42a, 42b), by applying the common potential to the third intermediate electrode 34a of the third beam 42a, a positive drive voltage is applied to the third bottom electrode 30a and the third top electrode 38a.

As shown in FIG. 10, in the first piezoelectric actuators (40a, 40b), a contraction stress is generated in the first bottom piezoelectric film 22a, and a tensile stress is generated in the first top piezoelectric film 26a. As a result, the first beam 40a supported at the first fixed end 60 bends further upward in a parabolic shape with a displacement Da from the initial state. In the second beam 40b, the second intermediate electrode 24b is electrically isolated. Therefore, the drive voltage is not applied to the second bottom piezoelectric film 22b and the second top piezoelectric film 26b. The second beam 40b is kept in the initial state. As a result, with respect to the first fixed end 60, while the first connecting end 62 is displaced upward with the displacement Da, the first working end 64 is displaced downward with a displacement Db.

As shown in FIG. 11, in the second piezoelectric actuators (42a, 42b), the contraction stress is generated in the third bottom piezoelectric film 32a, and the tensile stress is generated in the third top piezoelectric film 36a. As a result, the third beam 42a supported at the second fixed end 70 bends further downward, with the displacement Da, from the initial state. In the fourth beam 42b, the fourth intermediate electrode 34b is electrically isolated. Therefore, the drive voltage is not applied to the fourth bottom electrode piezoelectric film 32b and the fourth top piezoelectric film 36b. The fourth beam is kept in the initial state. As a result, with respect to the second fixed end 70, while the second connecting end 72 is displaced downward with the displacement Da, the second working end 74 is displaced upward with the displacement Db.

Hence, whether with or without residual stresses in the first and second bottom piezoelectric films 22a, 22b and the first and second top piezoelectric films 26a, 26b, it is possible to downwardly displace the first working portion 58 at the first working end 64 of the second beam 40b. Also, whether with or without residual stresses in the third and fourth bottom piezoelectric films 32a, 32b and the third and fourth top piezoelectric films 36a, 36b, it is possible to upwardly displace the second working portion 50 at the second working end 74 of the fourth beam 42b. Therefore, even if each of the first and second piezoelectric actuators (40a, 40b), (42a, 42b) warp in the initial state due to the residual stress, it is possible to control the interval between the first and second working ends 64, 74 repeatedly and with high precision by the drive voltage applied to the first and third beams 40a, 42a.

In addition, in the embodiment of the present invention, the first and second piezoelectric actuators (40a, 40b), (42a, 42b) are simultaneously driven so as to control the interval between the first and second working ends 64, 74. However, only one of the first and second piezoelectric actuators (40a, 40b), (42a, 42b) may be driven. For example, by driving the first piezoelectric actuators (40a, 40b), the first working end 64 is displaced with respect to the fixed second working end 74 so as to control the interval between the first and second working ends 64, 74.

Moreover, in the first and third beams 40a, 42a used as the respective driving beams of the first and second piezoelectric actuators (40a, 40b), (42a, 42b), a drive voltage of uniform polarity with respect to the common potential of the intermediate electrode is applied. However, by dividing the bottom electrode and top electrode of the driving beam, the polarity of the drive voltage applied to the bottom electrode and the top electrode can be inverted in the middle between the fixed end and the connecting end. In this case, the piezoelectric actuator can bend to a S-shape.

Each of the first to fourth beams 40a, 40b, 42a, 42b of the first and second piezoelectric actuators (40a, 40b), (42a, 42b) has a rectangular shape. However, for the first and second piezoelectric actuators (40a, 40b), (42a, 42b), a piezoelectric actuator having any shape, such as a C-ring shape, may be used. For example, in the case of a piezoelectric actuator having a C-ring shape, a middle point of the C-ring shape may be provided as the connecting end.

A method of manufacturing a micro-electromechanical device according to the embodiment of the present invention will be described with reference to a plan view and cross sectional views shown in FIGS. 12 to 16. Here, each cross sectional view used in the description corresponds to the cross section from the line E-E shown in FIG. 12.

Figure 12:
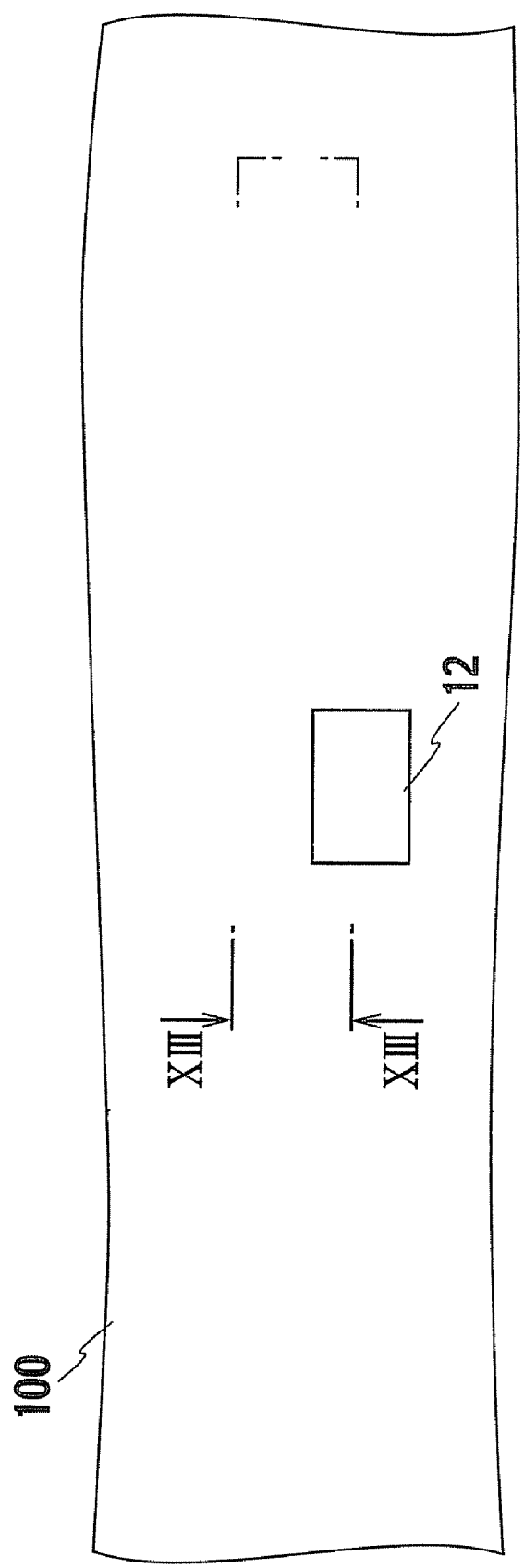
FIG. 12 is a plan view showing an example of a manufacturing method of the micro-electromechanical device according to the embodiment of the present invention.
Figure 13:
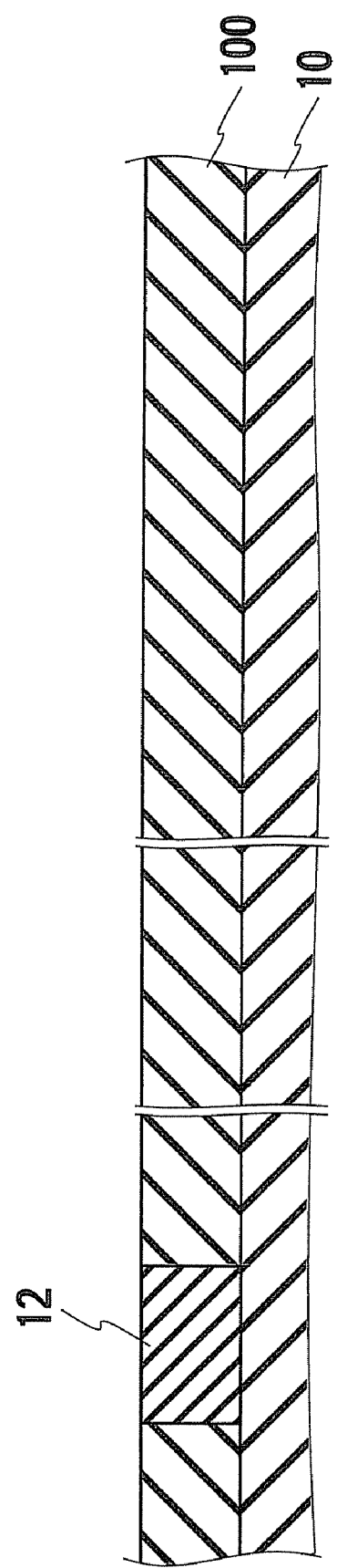
FIGS. 13 to 16 are cross sectional views showing an example of the manufacturing method of the micro-electromechanical device according to the embodiment of the present invention.

As shown in FIGS. 12 and 13, by chemical vapor deposition (CVD), photolithography, reactive ion etching (RIE), and the like, an insulating film, such as a $SiO_2$ film, is deposited on a surface of a substrate 10, such as an insulating glass substrate, so as to form an anchor 12. By plasma CVD and the like, an insulating film, such as a phosphosilicate glass (PSG) film, is deposited on the surface of the substrate 10, so as to bury the anchor 12. By chemical mechanical polishing (CMP) and the like, the insulating film is planarized so as to expose a surface of the anchor 12. Thus, a sacrificial layer 100 is formed.

Figure 14:
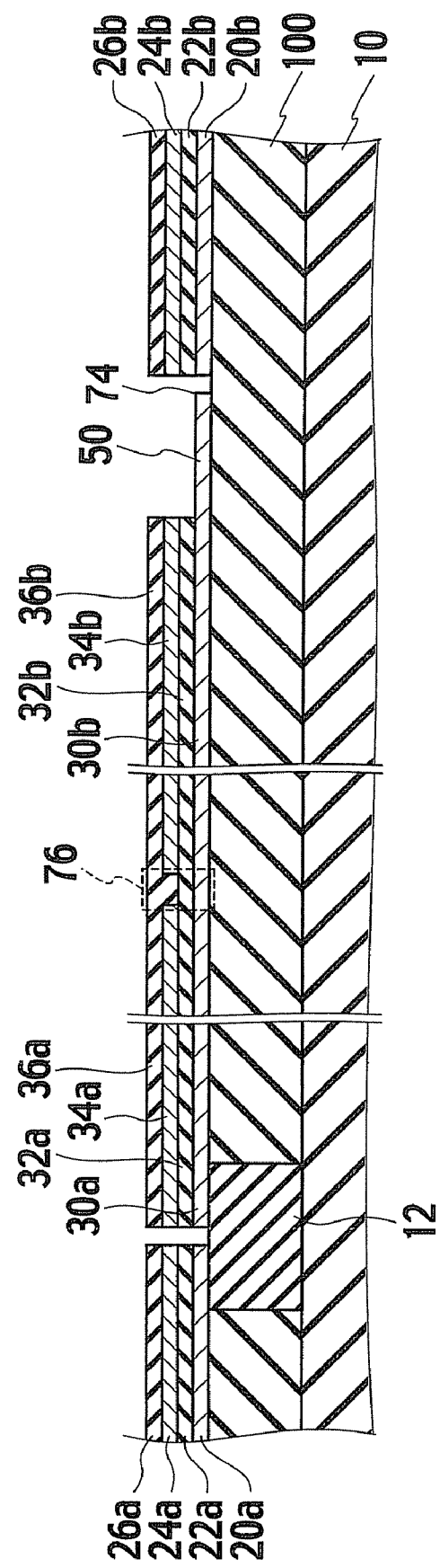

As shown in FIG. 14, by photolithography, vacuum evaporation and the like, a metal film, such as Au, is deposited at a thickness of about 200 nm, so as to form first to fourth bottom electrodes 20a, 20b, 30a, 30b extended on the sacrificial layer 100. Each end of the first and third bottom electrodes 20a, 30a is provided on the anchor 12. By reactive sputtering in a nitrogen ($N_2$) atmosphere and the like, a piezoelectric film, such as AlN oriented along the c-axis of the hexagonal crystal, is deposited at a thickness of about 500 nm on the sacrificial layer 100 where the first to fourth bottom electrodes 20a, 20b, 30a, 30b are formed. The piezoelectric film is selectively removed by photolithography, RIE and the like, to form first to fourth bottom piezoelectric films 22a, 22b, 32a and 32b on the first to fourth bottom electrodes 20a, 20b, 30a, 30b, respectively.

By photolithography, vacuum evaporation and the like, a metal film, such as Au, is selectively deposited at a thickness of about 200 nm, so as to form first to fourth intermediate electrodes 24a, 24b, 34a, 34b on the first to fourth bottom piezoelectric films 22a, 22b, 32a, 32b, respectively. The first and second intermediate electrodes 24a, 24b are electrically isolated at the first connecting portion 66 (not shown). The third and fourth intermediate electrodes 34a, 34b are electrically isolated at a second connecting portion 76. By reactive sputtering, photolithography, RIE and the like, a piezoelectric film, such as AlN, oriented along the c-axis of the hexagonal crystal, is selectively deposited at a thickness of about 500 nm so as to form first to fourth top piezoelectric films 26a, 26b, 36a, 36b on the first to fourth intermediate electrodes 24a, 24b, 34a, 34b, respectively. In addition, the fourth bottom piezoelectric film 32b, the fourth intermediate electrode 34b and the fourth top piezoelectric film 36b are patterned so as to expose a second working portion 50 provided in a second working end 74 of the fourth bottom electrode 30b.

Figure 15:
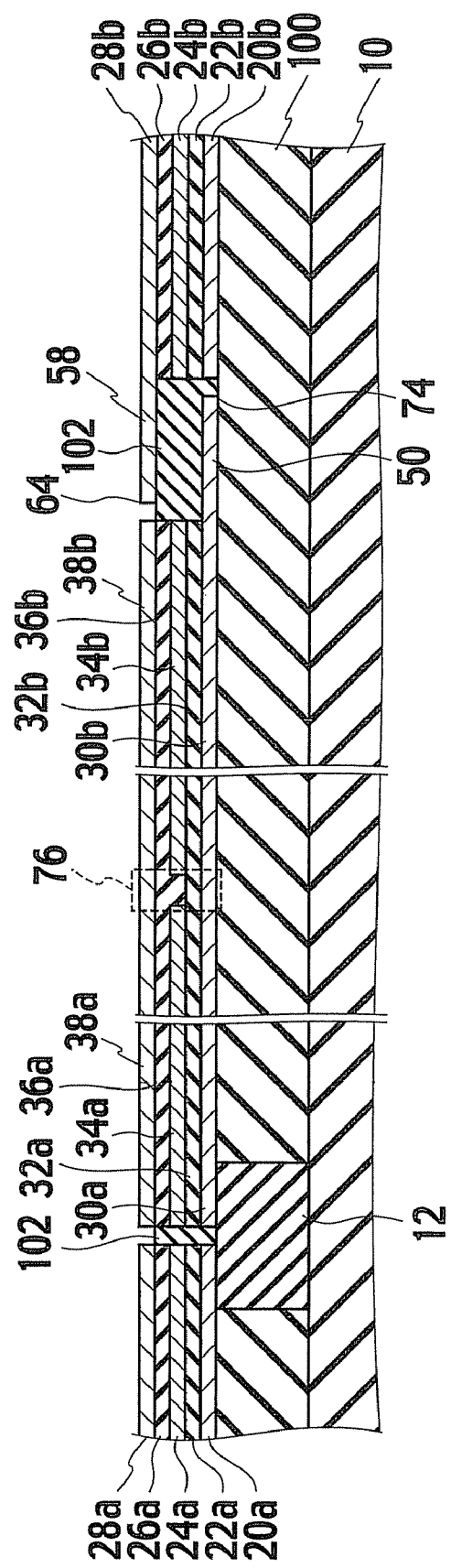

As shown in FIG. 15, by plasma CVD and the like, an insulating film, such as PSG, is deposited on the surface of the sacrificial layer 100 so as to bury the first to fourth top piezoelectric films 26a, 26b, 36a, 36b. By CMP and the like, the insulating film is planarized so as to expose surfaces of the first to fourth top piezoelectric films 26a, 26b, 36a, 36b. Thus, a sacrificial layer 102 is formed. By photolithography, vacuum evaporation and the like, a metal film, such as Au, is selectively deposited at a thickness of about 200 nm so as to form first to fourth top electrodes 28a, 28b, 38a, 38b on exposed surfaces of the first to fourth top piezoelectric films 26a, 26b, 36a, 36b, respectively. A first working portion 58 provided in a first working end 64 of the second top electrode 28b is formed so as to be on an opposite side of the second working portion 50 with respect to the sacrificial layer 102.

Figure 16:
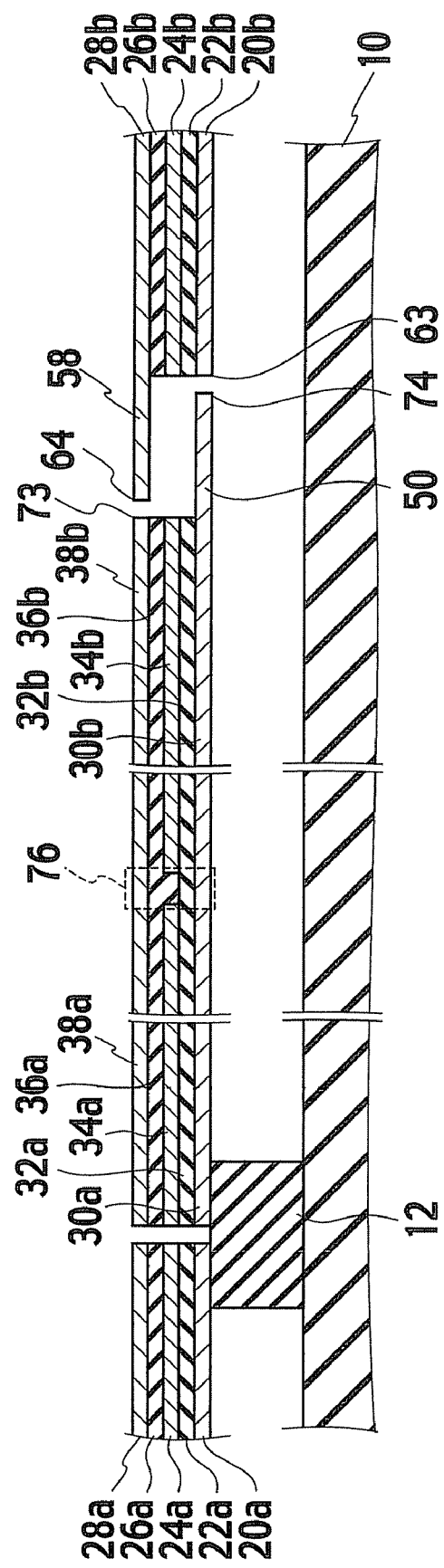

As shown in FIG. 16, by a wet etching procedure using a hydrofluoric acid (HF) solution and the like, the sacrificial layers 100, 102 are selectively removed. In this way, a micro-electromechanical device according to the embodiment of the present invention, shown in FIG. 1, is manufactured.

The manufactured micro-electromechanical device is used as a variable capacitor. In the first piezoelectric actuators (40a, 40b), by applying a common potential to the first intermediate electrode 24a, a drive voltage of about 0 V to about −3 V is applied to the first bottom electrode 20a and the first top electrode 28a. In the second piezoelectric actuators (42a, 42b), by applying a common potential to the third intermediate electrode 34a, a drive voltage of about 0 to about +3 V is applied to the third bottom electrode 30a and the third top electrode 38a. In this way, the capacitance is measured between the terminals connected to the first and second working portions 58, 50 of the variable capacitor. As a result, an extremely wide capacitance variation between a minimum capacitance of about 0.14 pF and a maximum capacitance of about 5.33 pF is achieved.

In addition, in the embodiment of the present invention, the PSG film is used for the sacrificial layers 100, 102. However, the material of the sacrificial layer is not so limited. For example, a material, such as an inorganic material, a metal material and an organic material, which is capable of selective etching against the materials of the substrate 10, the anchor 12, the first to fourth beams 40a, 40b, 42a, 42b and the like, can be used.

Figure 17:
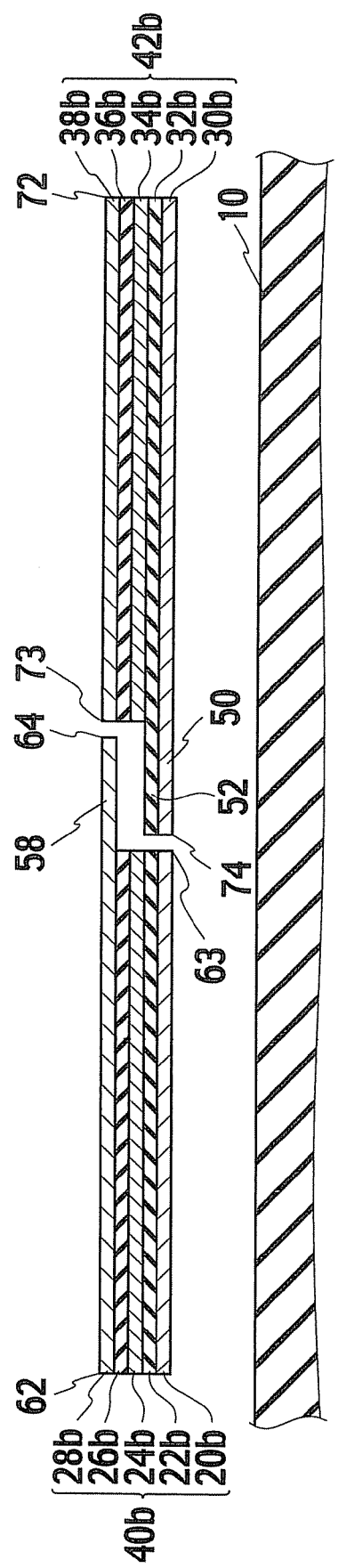
FIG. 17 is a schematic cross sectional view showing another example of the micro-electromechanical device according to the embodiment of the present invention.

Moreover, in the embodiment of the present invention, the first and second working portions 58, 50 made of metal films are used for electrodes of a variable capacitor. In order to prevent the first and second working portions 58, 50 from contacting each other because of an erroneous operation, a dielectric film may be inserted between the first and second working portions 58, 50. For example, as shown in FIG. 17, the fourth bottom piezoelectric film 32b can be used as the dielectric film. Alternatively, the second top piezoelectric film 26b may be used as the dielectric film.

An example of the variable capacitor using the piezoelectric actuator is described as the micro-electromechanical device according to the embodiment of the present invention. The piezoelectric actuator can be applied not only to the variable capacitor but also to a micro switch and the like. For example, using the same structure as shown in FIG. 1, the first and second working portions 58, 50 are brought into contact with each other. Thus, the piezoelectric actuator can be used as a DC contact type switch. Also, using the structure shown in FIG. 17, the piezoelectric actuator can be used as a capacitive type switch.

For example, a micro switch having the structure shown in FIG. 1 has been manufactured. In the first piezoelectric actuator (40a, 40b), by applying a common potential to the first intermediate electrode 24a, a negative drive voltage is applied to the first bottom electrode 20a and the first top electrode 28a. In the second piezoelectric actuator (42a, 42b), by applying the common potential to the third intermediate electrode 34a, a positive drive voltage is applied to the third bottom electrode 30a and the top electrode 38a. In this way, contact resistance is measured between the first and second working portions 58, 50 of the micro switch. As a result, at a drive voltage of about 3 V, the first and second working portions 58, 50 are brought into contact with each other. A contact resistance of about 1.2Ω is achieved.

(First Modification)

As shown in FIGS. 18 to 21, a micro-electromechanical device according to a first modification of the embodiment of the present invention includes the first to fourth beams 40a, 40b, 42a, 42b. The first fixed end 60 of the first beam 40a is fixed to an anchor 12a. The second beam 40b is connected to the first beam 40a at the first connecting end 62 and has the first working portion 58 at the first working end 64. The second fixed end 70 of the third beam 42a is fixed to an anchor 12b. The fourth beam 42b is connected to the third beam 42a at the second connecting end 72 and has the second working portion 50 at the second working end 74. The second working portion 50 faces the first working portion 58. The first fixed end 60 is positioned on an opposite side of the second fixed end 70 in a plane parallel to the surface of the substrate 10 with respect to a region in which the first and second working ends 64, 74 face each other.

The micro-electromechanical device according to the first modification in the embodiment of the present invention differs from the embodiment in that the first fixed end 60 is positioned on an opposite side of the second fixed end 70 with respect to the first and second working portions 58, 50. Other configurations are similar to the embodiment of the present invention. Thus, duplicated descriptions are omitted.

In the first modification of the embodiment of the present invention, the anchor 12a for fixing the first fixed end 60 and the anchor 12b for fixing the second fixed end 70 are independently provided. Thus, each fixed position of the first and second fixed ends 60, 70c an be adjusted. Therefore, it is possible that design freedom can be increased for the arrangement of the first to fourth beams 40a, 40b, 42a, 42b.

Figure 18:
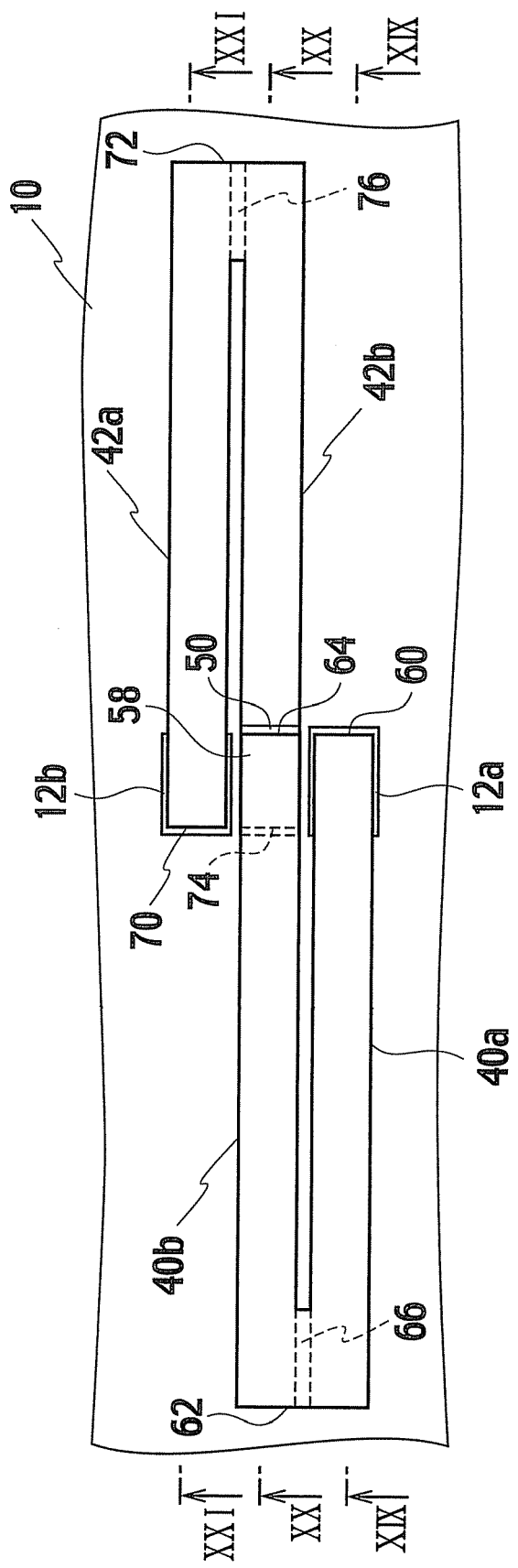
FIG. 18 is a schematic plan view showing an example of a micro-electromechanical device according to a first modification of the embodiment of the present invention.
Figure 19:
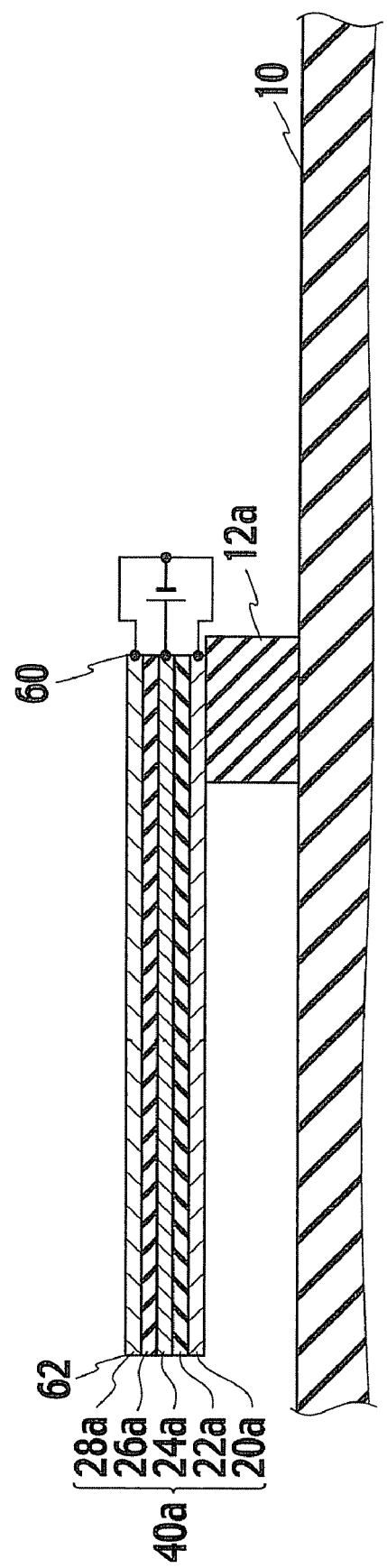
FIG. 19 is a schematic view showing an example of a cross section along a line XIX-XIX in the micro-electromechanical device of FIG. 18.
Figure 20:
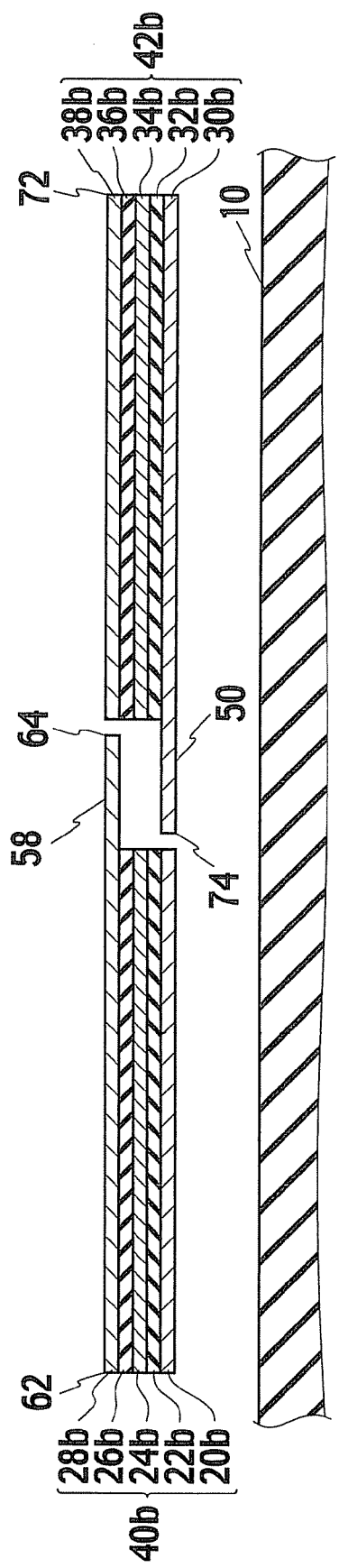
FIG. 20 is a schematic view showing an example of a cross section along a line XX-XX in the micro-electromechanical device of FIG. 18.
Figure 21:
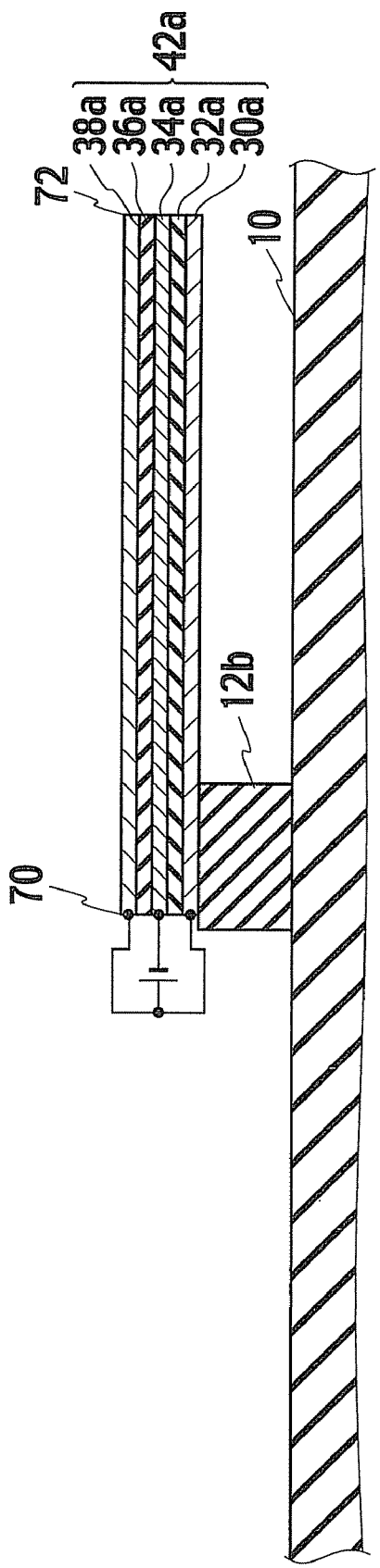
FIG. 21 is a schematic view showing an example of a cross section along a line XXI-XXI in the micro-electromechanical device of FIG. 18.

For example, as shown in FIG. 18, even when the first and second working portions 58, 50 face each other to overlap in a direction perpendicular to the surface of the substrate 10, each beam length of the first to fourth beams 40a, 40b, 42a, 42b can be substantially equal. As a result, it is possible to reduce warpages due to the difference of the beam lengths in the vicinity of the first and second working ends 64, 74.

Figure 22:
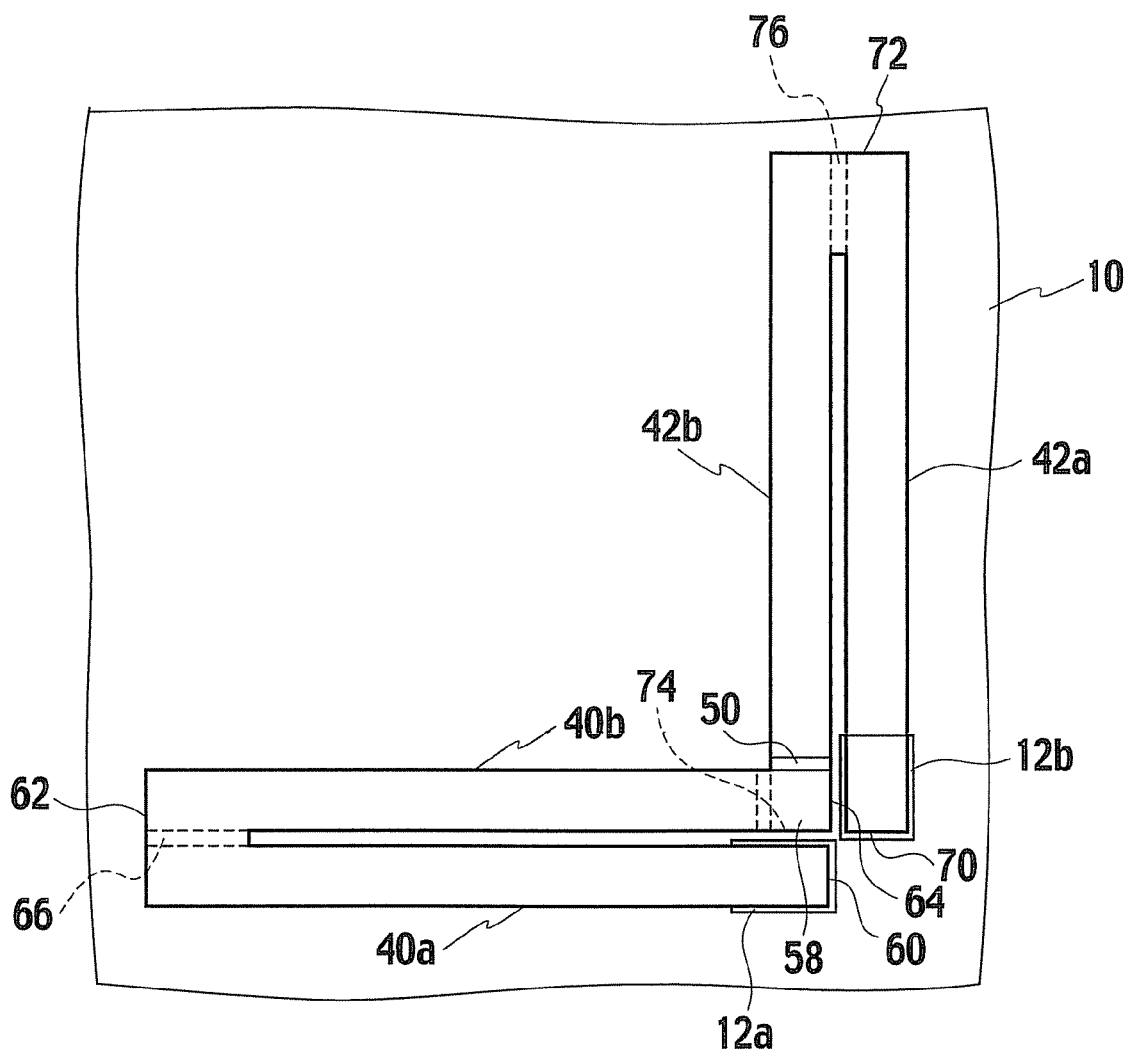
FIG. 22 is a schematic plan view showing another example of the micro-electromechanical device according to the first modification of the embodiment of the present invention.
Figure 23:
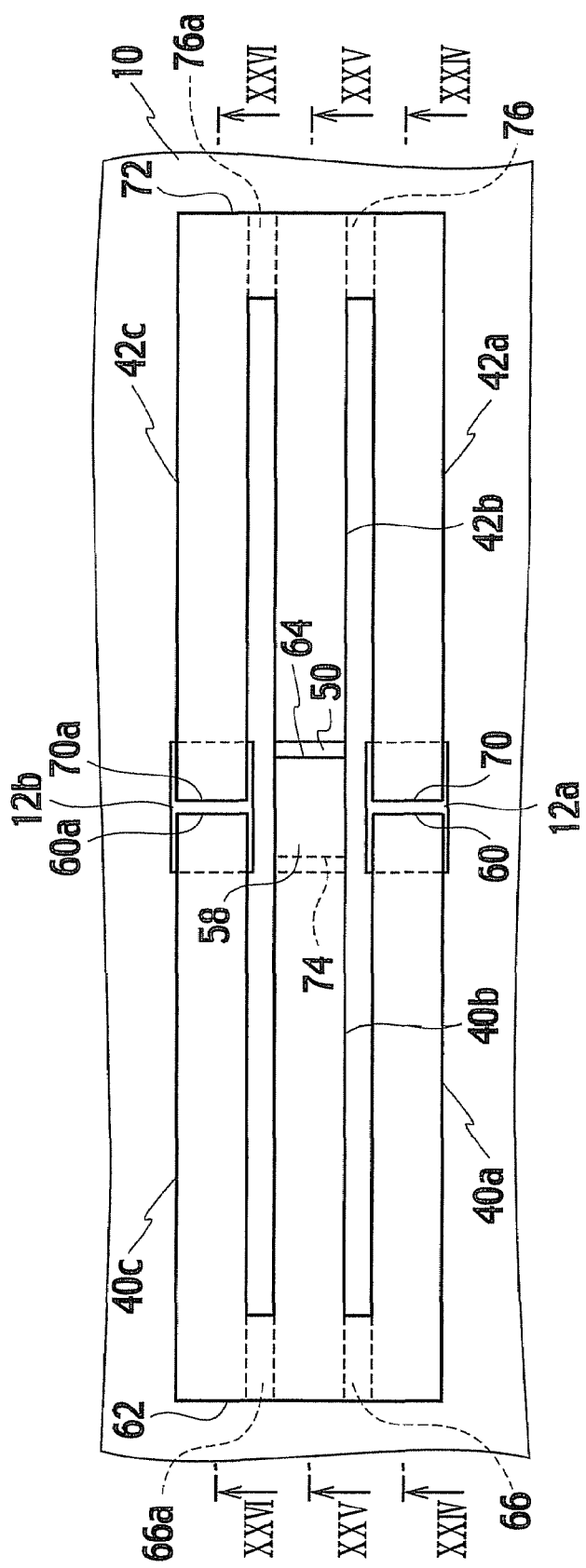
FIG. 23 is a schematic plan view showing an example of a micro-electromechanical device according to a second modification of the embodiment of the present invention.

Moreover, the first and second piezoelectric actuators (40a, 40b), (42a, 42b) may be arranged so as to be orthogonal with each other. As shown in FIG. 22, the first fixed end 60 fixed to the anchor 12a and the second fixed end 70 fixed to the anchor 12b are placed so as to be orthogonal with each other. The second and fourth beams 40b, 42b are arranged so as to intersect with each other at the first and second working portions 58, 50 which face each other. In this case, since the anchors 12a, 12b can be placed adjacent to each other; it is possible to provide extraction wiring of signal lines of the micro-electromechanical device in the same direction.

(Second Modification)

As shown in FIGS. 23 to 26, a micro-electromechanical device according to the second modification of the embodiment of the present invention includes a first piezoelectric actuator (40a, 40b, 40c) and a second piezoelectric actuator (42a, 42b, 42c). The first piezoelectric actuator (40a, 40b, 40c) includes the first beam 40a, the second beam 40b and a fifth beam 40c. The second piezoelectric actuator (42a, 42b, 42c) includes the third beam 42a, the fourth beam 42b and a sixth beam 42c. The fifth and sixth beams 40c, 42c are arranged in mirror symmetry to the first and third beams 40a, 42a with respect to the second and fourth beams 40b, 42b. The fifth and sixth beams 40c, 42c are substantially identical in shape to the first and third beams 40a, 42a, respectively.

The fifth beam 40c is provided on an opposite side of the first beam 40a with respect to the second beam 40b. The fifth beam 40c extends to the first connecting end 62 from a third fixed end 60a fixed to the anchor 12b on the substrate 10. The fifth beam 40c is connected to the second beam 40b through a first connecting portion 66a at the first connecting end 62.

The sixth beam 42c is provided on an opposite side of the third beam 42a with respect to the fourth beam 42b. The sixth beam 42c extends to the second connecting end 72 from a fourth fixed end 70a fixed to the anchor 12b on the substrate 10. The sixth beam 42c is connected to the fourth beam 42b through a second connecting portion 76a at the second connecting end 72.

The first and second working portions 58, 50, which face each other in a direction perpendicular to the surface of the substrate 10, are positioned between and adjacent to the first and second fixed ends 60, 70 and the third and fourth fixed ends 60a, 70a. A beam interval between the fifth and second beams 40c, 40b is substantially equal to the beam interval between the first and second beams 40a, 40b within a range of manufacturing errors. A beam interval between the sixth and fourth beams 42c, 42b is substantially equal to the beam interval between the second and fourth beams 42a, 42b within a range of manufacturing errors. Each beam interval between the fifth and second beams 40c, 40b and between the sixth and fourth beams 42c, 42b is shorter than the beam length of the second or fourth beam 40b, 42b.

The fifth beam 40c includes a fifth bottom electrode 20c, a fifth bottom piezoelectric film 22c on the fifth bottom electrode 20c, a fifth intermediate electrode 24c on the fifth bottom piezoelectric film 22c, a fifth top piezoelectric film 26c on the fifth intermediate electrode 24c, and a fifth top electrode 28c on the fifth top piezoelectric film 26c. Also, the sixth beam 42c includes a sixth bottom electrode 30c, a sixth bottom piezoelectric film 32c on the sixth bottom electrode 30c, a sixth intermediate electrode 34c on the sixth bottom piezoelectric film 32c, a sixth top piezoelectric film 36c on the sixth intermediate electrode 34c, and a sixth top electrode 38c on the sixth top piezoelectric film 36c.

The first and fifth bottom electrodes 20a, 20c are electrically connected to the second bottom electrode 20b at the first connecting portions 66, 66a. The first and fifth intermediate electrodes 24a, 24c are electrically isolated from the second intermediate electrode 24b at the first connecting portions 66, 66a. The first and fifth top electrodes 28a, 28c are electrically connected to the second top electrode 28b at the first connecting portions 66, 66a.

The third and sixth bottom electrodes 30a, 30c are electrically connected to the fourth bottom electrode 30b at the second connecting portions 76, 76a. The third and sixth intermediate electrodes 34a, 34c are electrically isolated from the fourth intermediate electrode 34b at the second connecting portions 76, 76a. The third and sixth top electrodes 38a, 38c are electrically connected to the fourth top electrode 38b at the second connecting portions 76, 76a.

Each of the first, second and fifth bottom piezoelectric films 22a, 22b and 22c, the first, second and fifth top piezoelectric films 26a, 26b, 26c, the third, fourth and sixth bottom piezoelectric films 32a, 32b, 32c, and the third, fourth and sixth top piezoelectric films 36a, 36b, 36c is a continuous piezoelectric layer. The first to sixth bottom piezoelectric films 22a, 22b, 22c, 32a, 32b, 32c, and the first to sixth top piezoelectric films 26a, 26b, 26c, 36a, 36b, 36c have the same polarization direction.

The micro-electromechanical device according to the second modification of the embodiment of the present invention differs from the embodiment in that the fifth and sixth beams 40c, 42c are included. Other configurations are similar to the embodiment of the present invention. Thus, duplicated descriptions are omitted.

Figure 24:
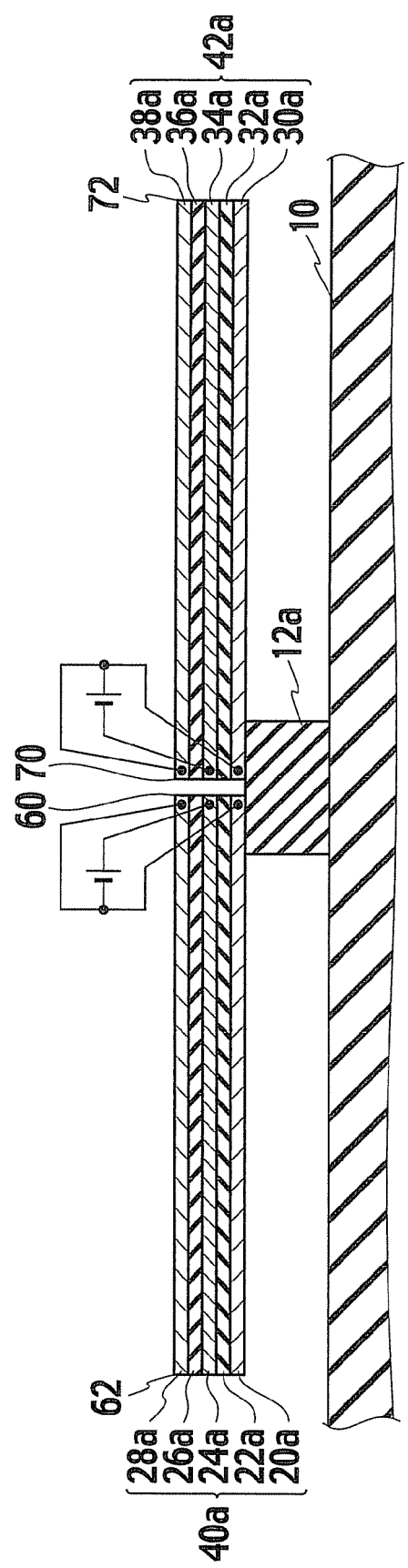
FIG. 24 is a schematic view showing an example of a cross section along a line XXIV-XXIV in the micro-electromechanical device of FIG. 23.
Figure 25:
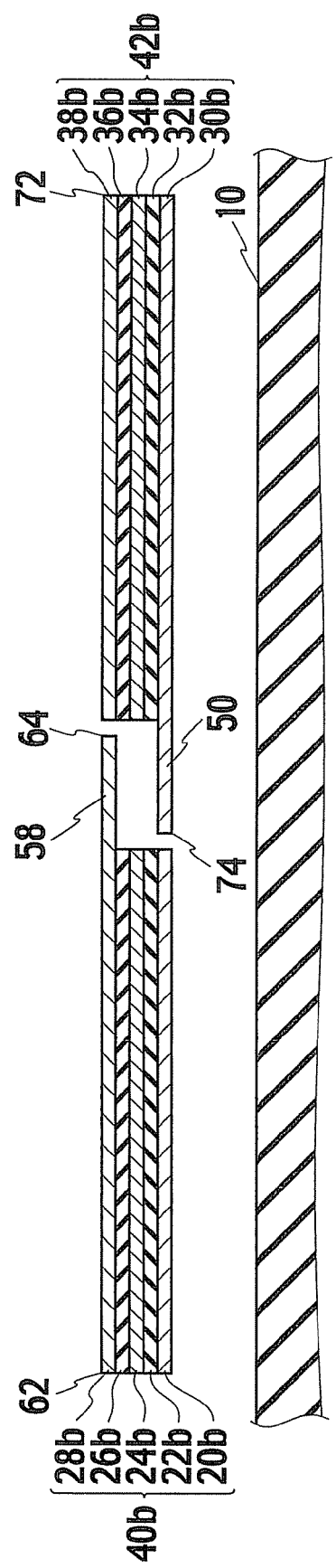
FIG. 25 is a schematic view showing an example of a cross section along a line XXV-XXV in the micro-electromechanical device of FIG. 23.
Figure 26:
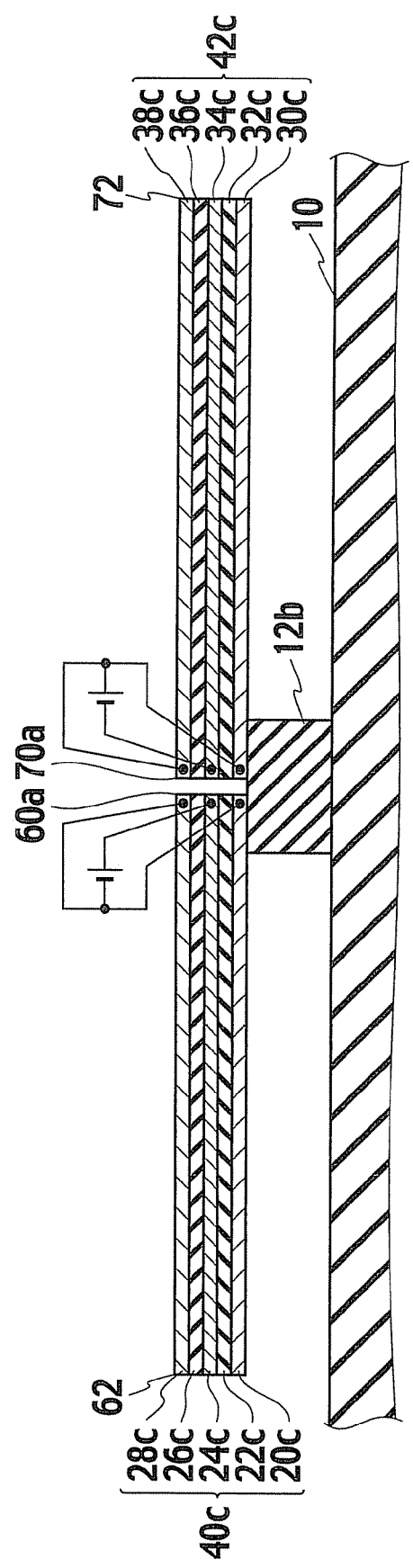
FIG. 26 is a schematic view showing an example of a cross section along a line XXVI-XXVI in the micro-electromechanical device of FIG. 23.

In the second modification of the embodiment of the present invention, as shown in FIG. 24 and FIG. 26, by applying a common potential to the first and fifth intermediate electrodes 24a, 24c, a negative drive voltage is applied to each of the first bottom electrode 20a, the first top electrode 28a, the fifth bottom electrode 20c and the fifth top electrode 28c. By applying the negative drive voltage, the first and fifth beams 40a, 40c bend upward in a parabolic shape from the initial state. On another hand, the second beam 40b is kept in the initial state. Thus, the first working end 64 is displaced downward in a direction toward the substrate 10.

Also, by applying the common potential to the third and sixth intermediate electrodes 34a, 34c, a positive drive voltage is applied to each of the third bottom electrode 30a, the third top electrode 38a, the sixth bottom electrode 30c and the sixth top electrode 38c. By applying the positive drive voltage, the third and sixth beams 42a, 42c bend downward in a parabolic shape from the initial state. On another hand, the fourth beam 42b is kept in the initial state. Thus, the second working end 74 is displaced in a direction away from the surface of the substrate 10.

The second beam 40b is positioned between the first and fifth beams 40a, 40c. Also, the fourth beam 42b is positioned between the third and sixth beams 42a, 42c. Thus, when the interval between the first and second working portions 58, 50 is controlled by the piezoelectric drive, it is possible to reduce a twisting stress generated in the first and second connecting ends 62, 72. As a result, the driving force of the first and second working portions 58, 50 may increase.

For example, when the micro-electromechanical device according to the second modification of the embodiment of the present invention is used as a variable capacitor, it is possible to vary capacitance of the variable capacitor repeatedly and accurately. Also, when the micro-electromechanical device according to the second modification of the embodiment of the present invention is used as a DC contact type switch, the pressing force for the first and second working portions 58, 50 is increased. Thus, there is an advantage in reducing a contact resistance between the first and second working portions 58, 50. Also, in the second modification of the embodiment of the present invention, since the first and second working ends 64, 74 are located between the first and second fixed ends 60, 70 and the third and fourth fixed ends 60a, 70a, it is possible to further reduce warpage influence in the first and second working ends 64, 74.

In the foregoing descriptions, the first and fifth beams 40a, 40c are used as the driving beams for the first piezoelectric actuator (40a, 40b, 40c), and the third and sixth beams 42a, 42c are used as the driving beams for the second piezoelectric actuator (42a, 42b, 42c) However, the second and fourth beams 40b, 42b may be used as the driving beams.

For example, the first and second bottom electrodes 20a, 20b are electrically connected, and the fifth bottom electrode 20c is electrically isolated. The second and fifth intermediate electrodes 24b, 24c are electrically connected, and the first intermediate electrode 24a is electrically isolated. The first and second top electrodes 28a, 28b are electrically connected, and the fifth top electrode 28c is electrically isolated.

Also, the third and fourth bottom electrodes 30a, 30b are electrically connected, and the sixth bottom electrode 30c is electrically isolated. The fourth and sixth intermediate electrodes 34b, 34c are electrically connected, and the third intermediate electrode 34a is electrically isolated. The third and fourth top electrodes 38a, 38b are electrically connected, and the sixth top electrode 38c is electrically isolated.

A positive drive voltage is applied to the electrodes (20a, 24a, 28a) of the first beam 40a and the electrodes (30c, 34c, 38c) of the sixth beam 42c, and the negative drive voltage is applied to the electrodes (20c, 24c, 28c) of the fifth beam 40c and the electrodes (30a, 34a, 38a) of the third beam 42a. There is substantially no potential difference between the respective electrodes of the first and third beams 40a, 42a, and between the respective electrodes of the fifth and sixth beams 40c, 42c. Therefore, each of the first, third, fifth and sixth beams 40a, 42a, 40c, 42c is kept in the initial state. In the second beam 40b, a negative drive voltage is applied to the second intermediate electrode 24b, and a positive drive voltage is applied to the second bottom electrode 20b and the second top electrode 28b. In the fourth beam 42b, a positive drive voltage is applied to the fourth intermediate electrode 34b, and a negative drive voltage is applied to the fourth bottom electrode 30b and the fourth top electrode 38b. Thus, the second beam 40b bends downward from the first connecting end 62, acting as a support point. Also, the fourth beam 42b bends upward from the second connecting end 72 so as to be a support point. As a result, it is possible to vary the interval between the first and second working portions 58, 50.

(Third Modification)

Figure 27:
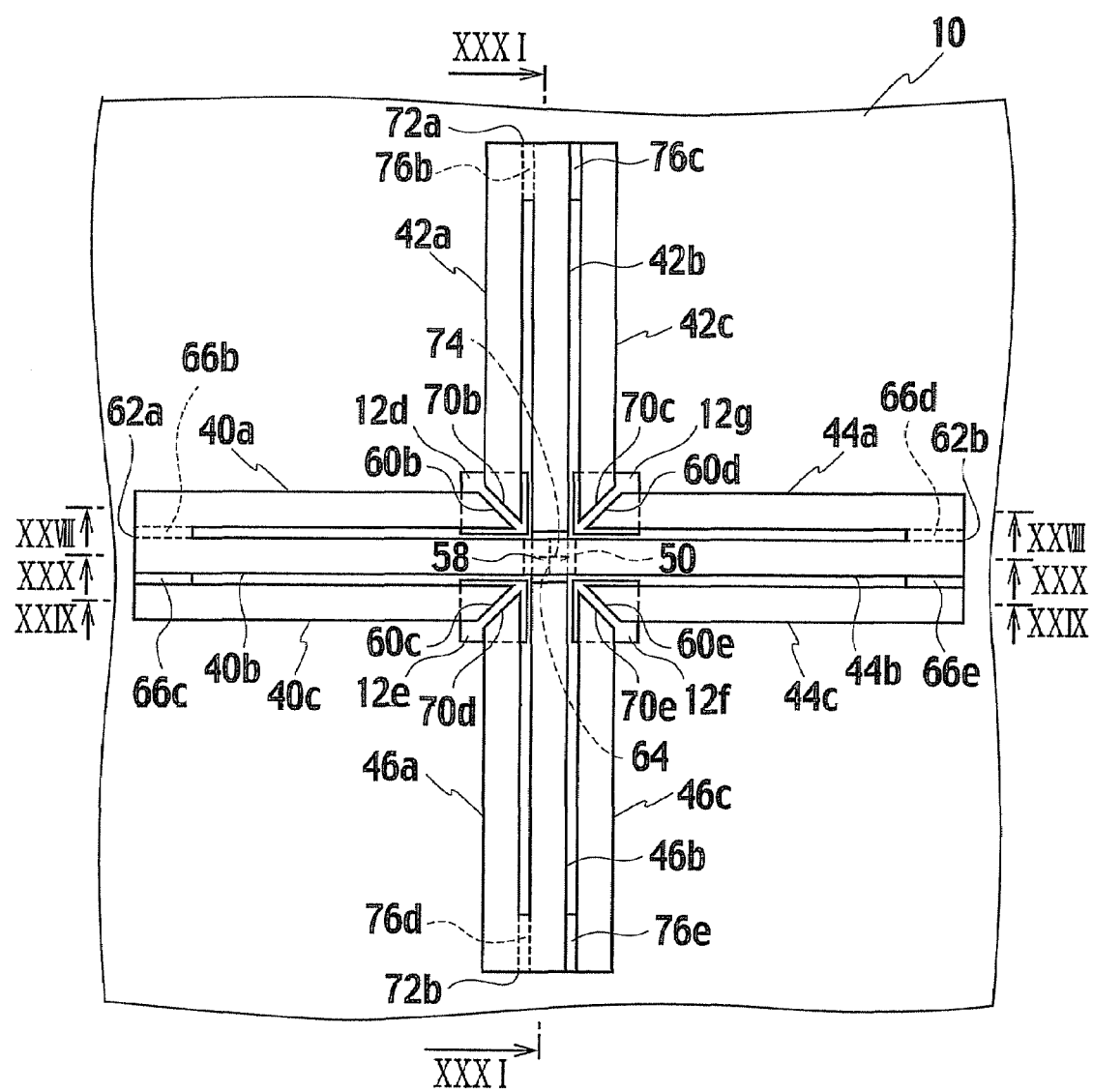
FIG. 27 is a schematic plan view showing an example of a micro-electromechanical device according to a third modification of the embodiment of the present invention.

As shown in FIG. 27, a micro-electromechanical device according to a third modification of the embodiment of the present invention includes the first piezoelectric actuator (40a, 40b, 40c), the second piezoelectric actuator (42a, 42b, 42c), a third piezoelectric actuator (44a, 44b and 44c) and a fourth piezoelectric actuator (46a, 46b and 46c). The first piezoelectric actuator (40a, 40b, 40c) includes the first beam 40a, the second beam 40b and the fifth beam 40c, which a reconnected through first connecting portions 66b, 66c. The second piezoelectric actuator (42a, 42b, 42c) includes the third beam 42a, the fourth beam 42b and the sixth beam 42c, which a reconnected through second connecting portions 76b, 76c. The third piezoelectric actuator (44a, 44b and 44c) includes a first beam 44a, a second beam 44b and a fifth beam 44c, which are connected through first connecting portions 66d, 66e. The fourth piezoelectric actuator (46a, 46b and 46c) includes a third beam 46a, a fourth beam 46b and a sixth beam 46c, which are connected through second connecting portions 76d, 76e. The first to fourth piezoelectric actuators (40a, 40b, 40c), (42a, 42b, 42c), (44a, 44b, 44c) and (46a, 46b, 46c) are arranged in a crisscross shape so as to extend in a direction perpendicular to each other on a plane parallel to the surface of the substrate 10.

The first beam 40a extends from a first fixed end 60b fixed to an anchor 12d on the substrate 10 to a first connecting end 62a. The second beam 40b is folded along the first beam 40a from the first connecting end 62a and extends to the first working end 64. The fifth beam 40c extends from a third fixed end 60c fixed to an anchor 12e on the substrate 10 to the first connecting end 62a.

The first beam 44a extends from a first fixed end 60d fixed to an anchor 12g on the substrate 10 to a first connecting end 62b. The second beam 44b is folded along the first beam 44a from the first connecting end 62b and extends to the first working end 64. The fifth beam 44c extends from a third fixed end 60e fixed to an anchor 12f on the substrate 10 to the first connecting end 62b.

The third beam 42a extends from a second fixed end 70b fixed to the anchor 12d to a second connecting end 72a. The fourth beam 42b is folded along the third beam 42a from the second connecting end 72a and extends to the second working end 74. The sixth beam 42c extends from a fourth fixed end 70c fixed to the anchor 12g to the second connecting end 72a.

The sixth beam 46a extends from a second fixed end 70d fixed to the anchor 12e to a second connecting end 72b. The fourth beam 46b is folded along the third beam 46a from the second connecting end 72b and extends to the second working end 74. The sixth beam 46c extends from a fourth fixed end 70e fixed to the anchor 12f to the second connecting end 72b.

The first working portion 58 is provided in the second beams 40b, 44b on both sides of the first working end 64 so as to share the first working end 64. The second working portion 50 facing the first working portion 58 is provided in the fourth beams 42b, 46b on both sides of the second working end 74 so as to share the second working end 74.

The first, second and fifth beams 40a, 40b, 40c are paired with first, second and fifth beams 44a, 44b, 44c so as to be located on both sides of the first working end 64 in mirror symmetry with respect to the first working end 64. Also, a pair of third, fourth and sixth beams 42a, 42b, 42c and a pair of third, fourth and sixth beams 46a, 46b, 46c are positioned on both sides of the second working end 74 in mirror symmetry with respect to the second working end 74.

As shown in FIGS. 28 to 31, the first, second and fifth beams 44a, 44b, 44c have structures similar to the first, second and fifth beams 40a, 40b, 40c, respectively. The first beam 44a includes a first bottom electrode 20d, a first bottom piezoelectric film 22d, a first intermediate electrode 24d, a first top piezoelectric film 26d and a first top electrode 28d. The second beam 44b includes a second bottom electrode 20e, a second bottom piezoelectric film 22e, a second intermediate electrode 24e, a second top piezoelectric film 26e and a second top electrode 28d. The fifth beam 44c includes a fifth bottom electrode 20f, a second bottom piezoelectric film 22f, a second intermediate electrode 24f, a second top piezoelectric film 26f and a second top electrode 28f.

Also, the third, fourth and sixth beams 46a, 46b and 46c have structures similar to the third, fourth and sixth beams 42a, 42b, 42c, respectively. The third beam 46a includes a third bottom electrode 30d, a third bottom piezoelectric film 32d, a third intermediate electrode 34d, a third top piezoelectric film 36d and a third top electrode 38d. The fourth beam 46b includes a fourth bottom electrode 30e, a fourth bottom piezoelectric film 32e, a fourth intermediate electrode 34e, a fourth top piezoelectric film 36e and a fourth top electrode 38d. The sixth beam 46c includes a sixth bottom electrode 30f, a sixth bottom piezoelectric film 32f, a sixth intermediate electrode 34f, a sixth top piezoelectric film 36f and a sixth top electrode 38f.

The piezoelectric actuator according to the third modification of the embodiment of the present invention differs from the second modification in that the first and second piezoelectric actuators, which extend in a direction perpendicular to each other, are symmetrically positioned by sharing the first and second working ends 64, 74, so as to be a double-clamped suspended structure. Other configurations are similar to the second modification. Thus, the duplicated descriptions are omitted.

Figure 32:
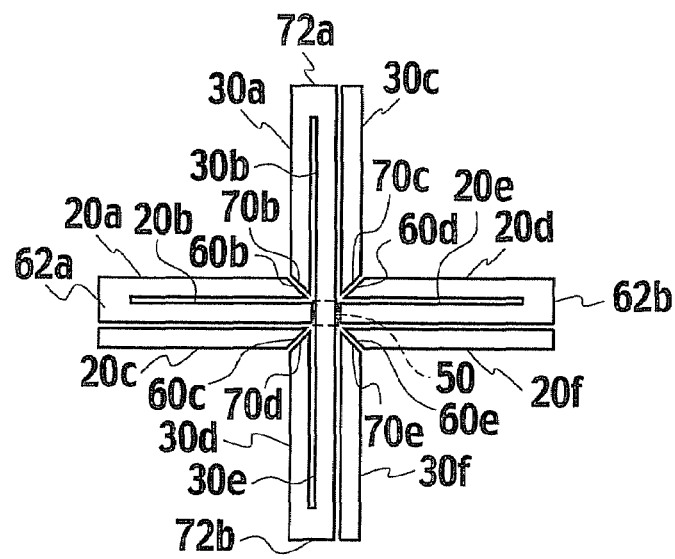
FIG. 32 is a schematic plan view showing an example of a bottom electrode of the micro-electromechanical device according to the third modification in the embodiment of the present invention.

For example, as shown in FIG. 32, at the first connecting end 62a, the first and second bottom electrodes 20a, 20b are electrically connected, and the fifth bottom electrode 20c is electrically isolated. At the first connecting end 62b, the first and second bottom electrodes 20d, 20e are electrically connected, and the fifth bottom electrode 20f is electrically isolated. At the second connecting end 72a, the third and fourth bottom electrodes 30a, 30b are electrically connected, and the sixth bottom electrode 30c is electrically isolated. At the second connecting end 72b, the third and fourth bottom electrodes 30d, 30e are electrically connected, and the sixth bottom electrode 30f is electrically isolated. The fourth bottom electrodes 30b, 30e are connected through the second working portion 50.

Figure 33:
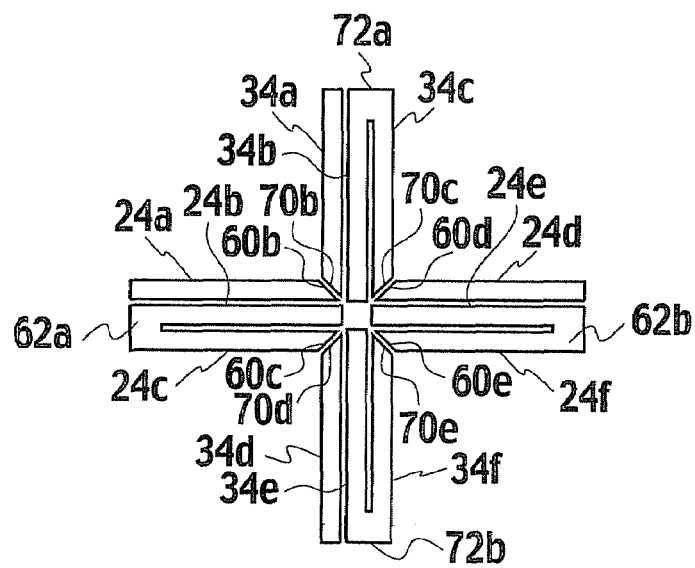
FIG. 33 is a schematic plan view showing an example of an intermediate electrode of the micro-electromechanical device according to the third modification in the embodiment of the present invention.

As shown in FIG. 33, at the first connecting end 62a, the first intermediate electrode 24a is electrically isolated, and the second and fifth intermediate electrodes 24b, 24c are electrically connected. At the first connecting end 62b, the first intermediate electrode 24d is electrically isolated, and the second and fifth intermediate electrodes 24e, 24f are electrically connected. At the second connecting end 72a, the third intermediate electrode 34a is electrically isolated, and the fourth and sixth intermediate electrodes 34b, 34c are electrically connected. At the second connecting end 72b, the first intermediate electrode 34d is electrically isolated, and the second and fifth intermediate electrodes 34e, 34f are electrically connected.

Figure 34:
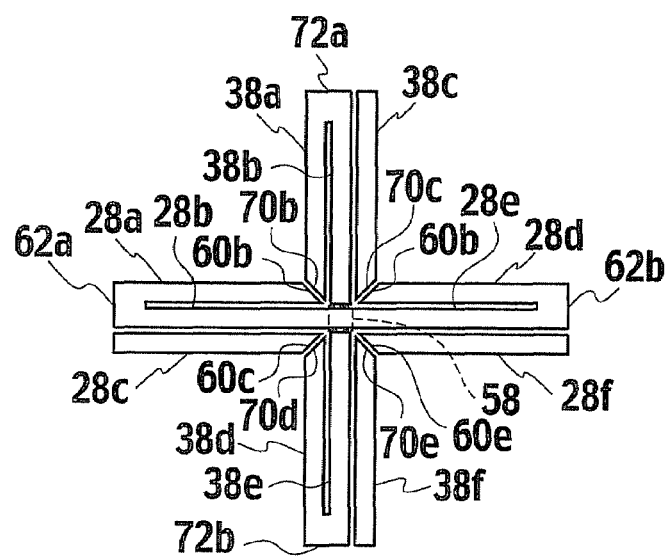
FIG. 34 is a schematic plan view showing an example of a top electrode of the micro-electromechanical device according to the third modification in the embodiment of the present invention.

As shown in FIG. 34, at the first connecting end 62a, the first and second top electrodes 28a, 28b are electrically connected, and the fifth top electrode 28c is electrically isolated. At the first connecting end 62b, the first and second top electrodes 28d, 28e are electrically connected, and the fifth top electrode 28f is electrically isolated. At the second connecting end 72a, the third and fourth top electrodes 38a, 38b are electrically connected, and the sixth top electrode 38c is isolated. At the second connecting end 72b, the third and fourth top electrodes 38d, 38e are electrically connected, and the sixth top electrode 38f is isolated. The second top electrodes 28b, 28e are connected through the first working portion 58.

Figure 28:
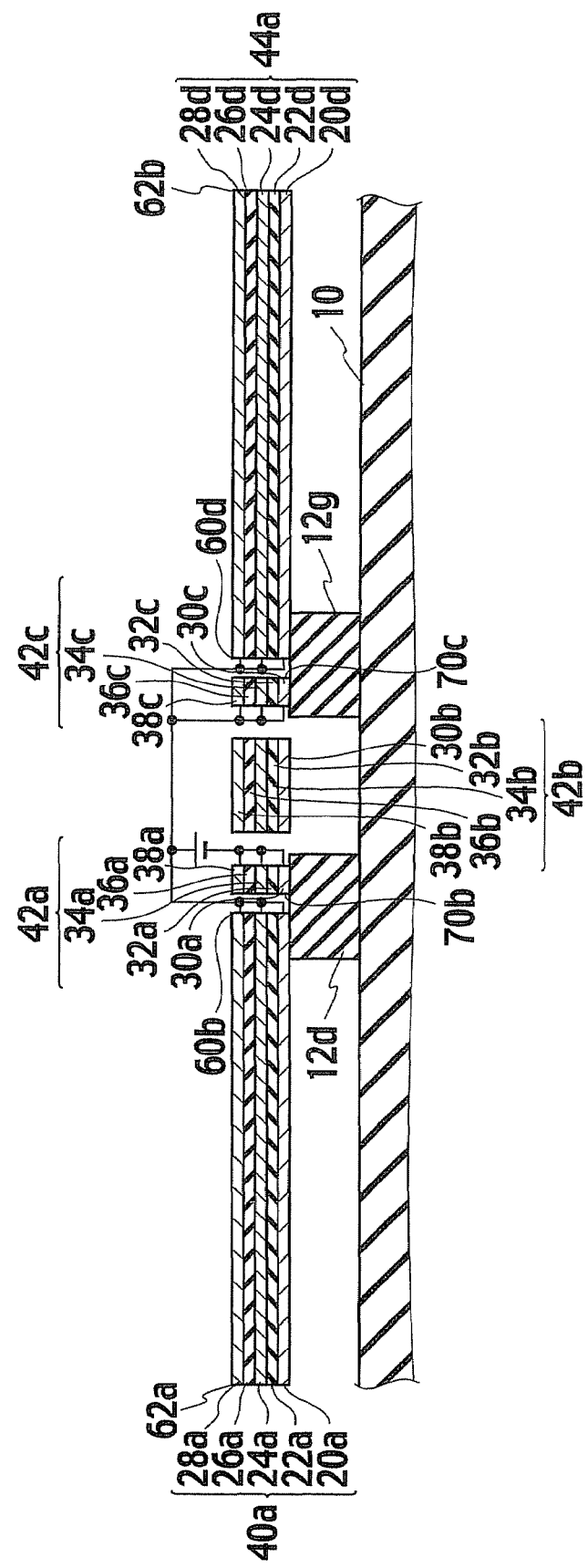
FIG. 28 is a schematic view showing an example of a cross section along a line XXVIII-XXVIII in the micro-electromechanical device of in FIG. 27.
Figure 29:
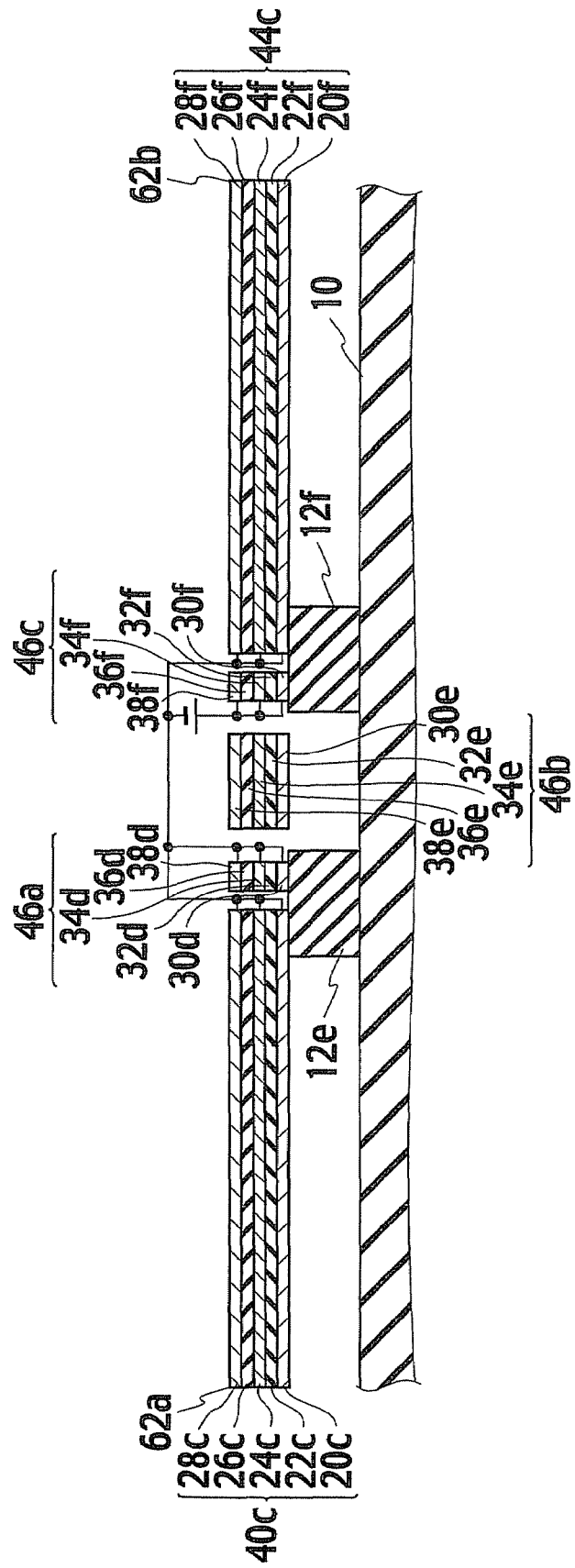
FIG. 29 is a schematic view showing an example of a cross section along a line XXIX-XXIX in the micro-electromechanical device of FIG. 27.
Figure 30:
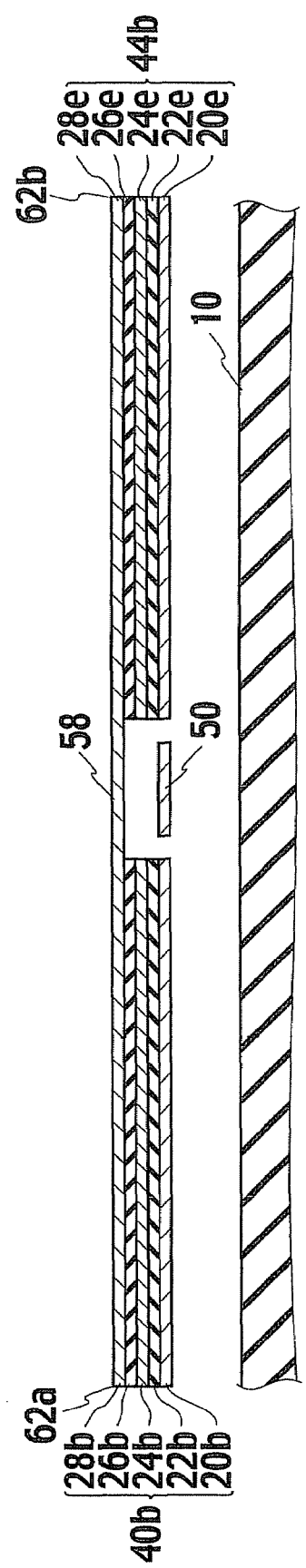
FIG. 30 is a schematic view showing an example of a cross section along a line XXX-XXX in the micro-electromechanical device of FIG. 27.
Figure 31:
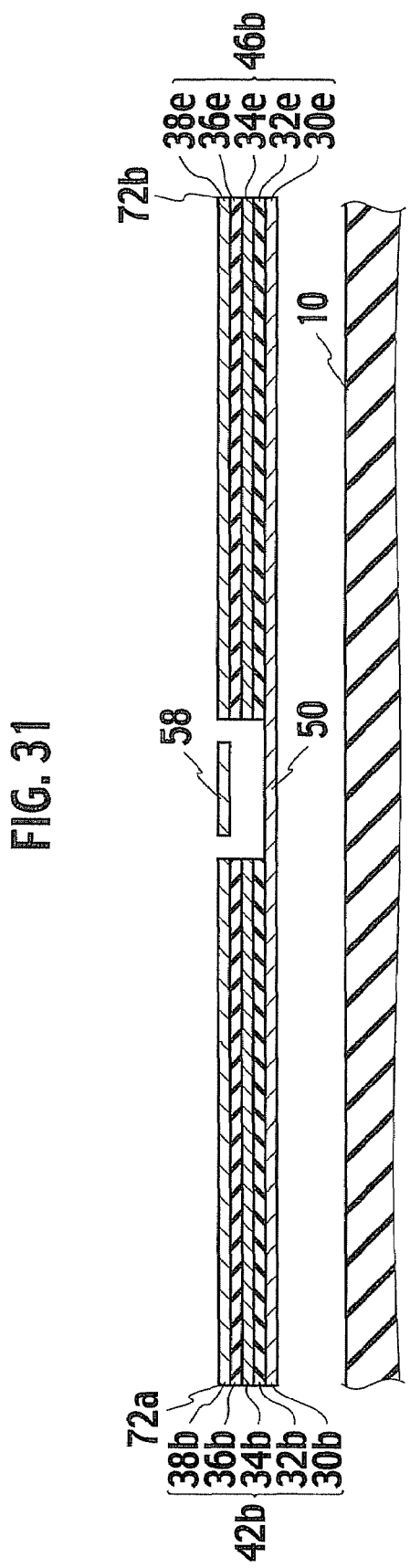
FIG. 31 is a schematic view showing an example of a cross section along a line XXXI-XXXI in the micro-electromechanical device of FIG. 27.

In the third modification of the embodiment of the present invention, as shown in FIG. 28, a negative drive voltage is applied to the third bottom electrode 30a, the third intermediate electrode 34a and the third top electrode 38a, and a positive drive voltage is applied to the first bottom electrodes 20a, 20d, the first intermediate electrodes 24a, 24d, the first top electrodes 28a, 28d, the sixth bottom electrode 30c, the sixth intermediate electrode 34c and the sixth top electrode 38c. Also, as shown in FIG. 29, a negative drive voltage is applied to the fifth bottom electrodes 20c, 20f, the fifth intermediate electrodes 24, 24f, the fifth top electrodes 28c, 28f, the third bottom electrode 30d, the third intermediate electrode 34d and the third top electrode 38d. A positive drive voltage is applied to the sixth bottom electrode 30f, the sixth intermediate electrode 34f and the sixth top electrode 38f.

As described above, the second beams 40b, 44b, connected through the first working portion 58, and the fourth beams 42b, 46b, connected through the second working portion 50, can be used as the driving beams. The second beams 40b, 44b bend downward from the second connecting ends 72a, 72b acting as support points. As a result, it is possible to vary the interval between the first and second working portions 58, 50.

In the third modification of the embodiment of the present invention, the second beams 40b, 44b are provided between the first and fifth beams 40a, 44a, 40c, 44c. Also, the fourth beams 42b, 46b are provided between the third and sixth beams 42a, 46a, 42c, 46c. Therefore, when the interval between the first and second working portions 58, 50 is controlled by the piezoelectric drive, it is possible to substantially reduce a twisting stress applied to each of the first and second connecting ends 62a, 62b, 72a and 72b. As a result, the driving force for the first and second working portions 58, 50 is increased.

In the foregoing descriptions, the second and fourth beams 40b, 44b, 42b and 46b are used as the driving beams. However, by changing the connection of each electrode between the first to sixth beams 40a to 40c, 42a to 42c, 44a to 44c, 46a to 46c, the first, fifth, third and sixth beams 40a, 44a, 40c, 44c, 42a, 42c, 46a, 46c may be used as driving beams. In this case, the fifth and sixth beams 40c, 44c, 42c and 46c may be omitted.

OTHER EMBODIMENTS

Figure 35:
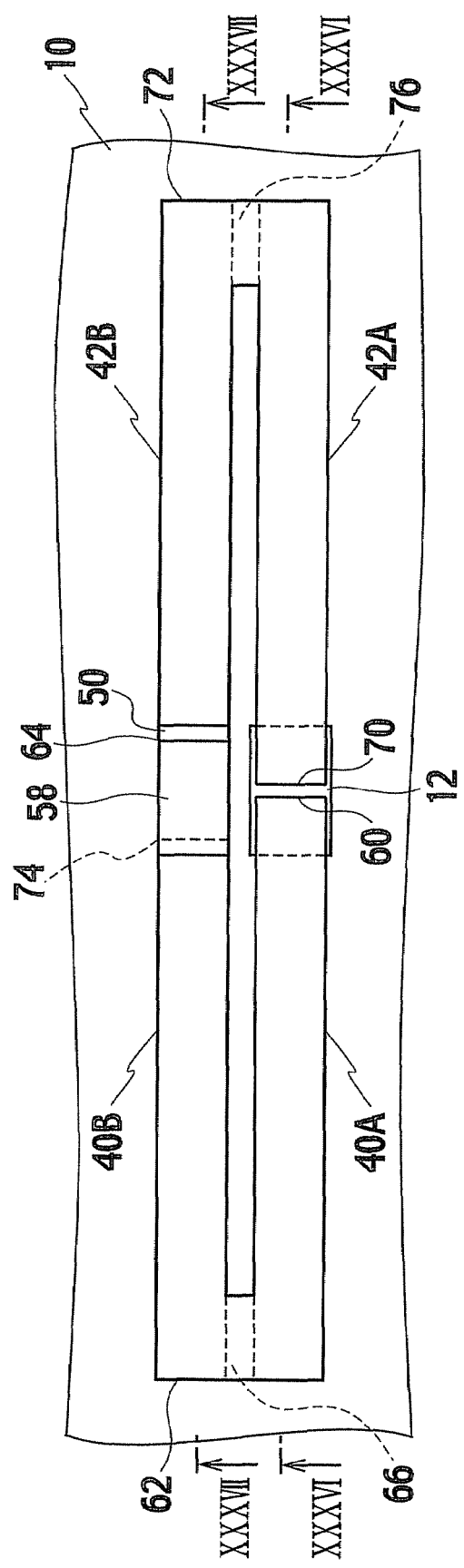
FIG. 35 is a schematic plan view showing an example of a micro-electromechanical device according to another embodiment of the present invention.

In the micro-electromechanical device according to the embodiment of the present invention, a piezoelectric actuator having a bimorph structure is used. However, an asymmetric bimorph structure or a unimorph structure may be used. For example, as shown in FIG. 35, first and second piezoelectric actuators having a unimorph structure are used. The first piezoelectric actuator includes a first beam 40A and a second beam 40B. The second piezoelectric actuator includes a third beam 42A and a fourth beam 42B.

The first beam 40A extends from the first fixed end 60 fixed to the anchor 12 on the substrate 10 to the first connecting end 62. The second beam 40B extends from the first connecting end 62 to the first working end 64 in the direction toward the first fixed end 60 in parallel to the first beam 40A. The third beam 42A extends from the second fixed end 70 fixed to the anchor 12 to the second connecting end 72. The fourth beam 42B extends from the second connecting end 72 to the second working end 74 in the direction toward the second fixed end 70 in parallel to the third beam 42A. The first working portion 58 of the first working end 64 and the second working portion 50 of the second working end 74 face each other.

Figure 36:
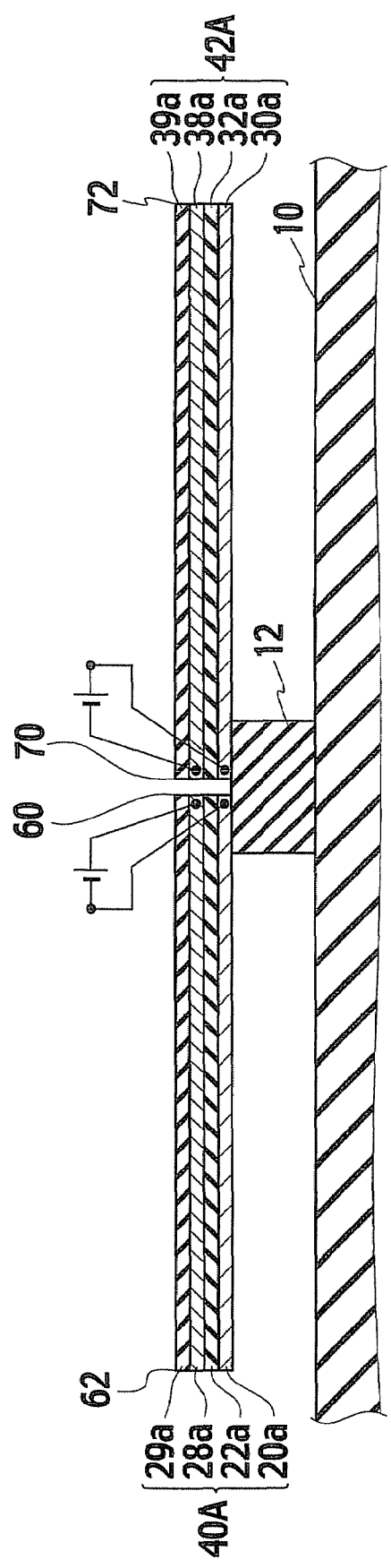
FIG. 36 is a schematic view showing an example of a cross section along a line XXXVI-XXXVI in the micro-electromechanical device of FIG. 35.

As shown in FIG. 36, the first beam 40A includes the first bottom electrode 20a, the first piezoelectric film 22a on the first bottom electrode 20a, the first top electrode 28a on the first piezoelectric film 22a, and a first support film 29a on the first top electrode 28a. The third beam 42A includes the third bottom electrode 30a, the third piezoelectric film 32a on the third bottom electrode 30a, the third top electrode 38a on the third piezoelectric film 32a, and a third support film 39a on the third top electrode 38a.

Figure 37:
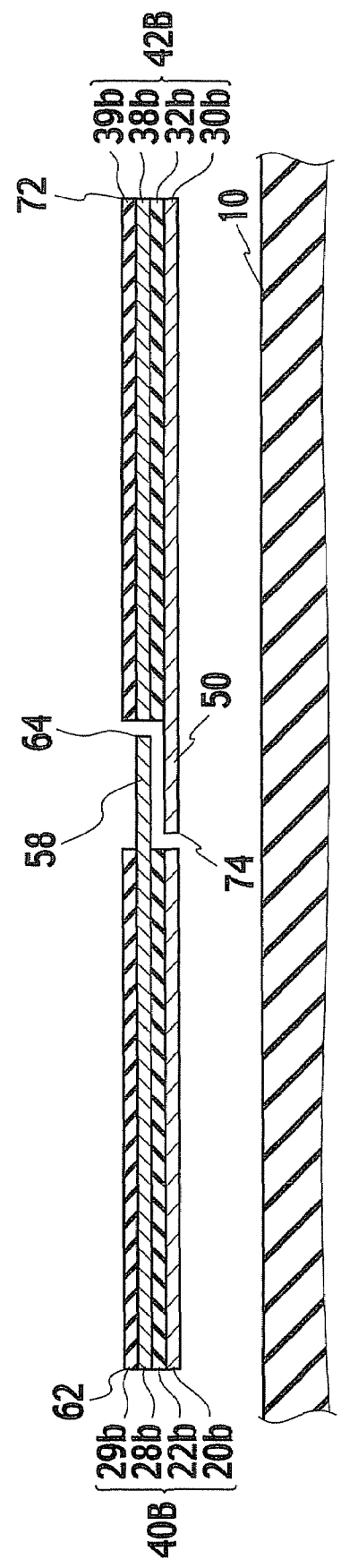
FIG. 37 is a schematic view showing an example of a cross section along a line XXXVII-XXXVII in the micro-electromechanical device of FIG. 35.

As shown in FIG. 37, the second beam 40B includes the second bottom electrode 20b, the second piezoelectric film 22b on the second bottom electrode 20b, the second top electrode 28b on the second piezoelectric film 22b, and a second support film 29b on the second top electrode 28b. The fourth beam 42B includes the fourth bottom electrode 30b, the fourth piezoelectric film 32b on the fourth bottom electrode 30b, the fourth top electrode 38b on the fourth piezoelectric film 32b, and a fourth support film 39b on the fourth top electrode 38b.

The first and second bottom electrodes 20a, 20b are separated so as to be electrically isolated at the first connecting portion 66. The first and second top electrodes 28a, 28b are electrically connected at the first connecting portion 66. The third and fourth bottom electrodes 30a, 30b are electrically connected at the second connecting portion 76. The third and fourth top electrodes 38a, 38b are separated so as to be electrically isolated at the second connecting portion 76. The first and second piezoelectric films 22a, 22b are a continuous piezoelectric layer connected at the first connecting portion 66. The third and fourth piezoelectric films 32a, 32b are a continuous piezoelectric layer connected at the second connecting portion 76.

An insulating film, such as $SiO_2$, $Si_3N_4$, is used for the first to fourth support films 29a, 29b, 39a and 39b. When the drive voltage is applied between the first and third bottom electrodes 20a, 30a and the first and third top electrodes 28a, 38a of the first and third beams 40A, 42A, the first and third piezoelectric films 22a, 32a distort so as to expand or to contract due to the piezoelectric effect, respectively. The first and third support films 29a, 39a provided on the first and third top electrodes 28a, 38a do not exhibit a piezoelectric effect. Also, the drive voltage is not applied to the second and fourth beams 40B, 42B. Thus, it is possible to displace the first and second working portions 58, 50 in a direction perpendicular to the surface of the substrate 10 by the driving force of the first and third beams 40A, 42A.

Various modifications will become possible for those skilled in the art after storing the teachings of the present disclosure without departing from the scope thereof.

What is claimed is:

1. A micro-electromechanical device, comprising:
   a first piezoelectric actuator including a first beam and a second beam, the second beam extending parallel to the first beam, a first fixed end positioned at an end of the first beam, a first connecting end positioned at another end of the first beam, a first working end positioned at an end of the second beam opposite to the first connecting end where another end of the second beam is located, the first fixed end fixed on a substrate; and
   a second piezoelectric actuator including a third beam spaced from the first beam and a fourth beam extending parallel to the third beam, a second fixed end positioned at an end of the third beam, a second connecting end positioned at another end of the third beam, a second working end positioned at an end of the fourth beam opposite to the second connecting end where another end of the fourth beam is located, the second fixed end fixed on the substrate, the second working end facing the first working end in a perpendicular direction to a surface of the substrate and separated from the first working end, wherein
   the first beam includes a first bottom electrode, a first bottom piezoelectric film on the first bottom electrode, a first intermediate electrode on the first bottom piezoelectric film, a first top piezoelectric film on the first intermediate electrode, and a first top electrode on the first top piezoelectric film;
   the second beam includes a second bottom electrode, a second bottom piezoelectric film on the second bottom electrode, a second intermediate electrode on the second bottom piezoelectric film, a second top piezoelectric film on the second intermediate electrode, and a second top electrode on the second top piezoelectric film;
   the third beam includes a third bottom electrode, a third bottom piezoelectric film on the third bottom electrode, a third intermediate electrode on the third bottom piezoelectric film, a third top piezoelectric film on the third intermediate electrode, and a third top electrode on the third top piezoelectric film; and
   the fourth beam includes a fourth bottom electrode, a fourth bottom piezoelectric film on the fourth bottom electrode, a fourth intermediate electrode on the fourth bottom piezoelectric film, a fourth top piezoelectric film on the fourth intermediate electrode, and a fourth top electrode on the fourth top piezoelectric film, and wherein, in the first connecting end:
   the first and second bottom electrodes are electrically connected to each other;
   the first and second intermediate electrodes are electrically isolated from each other; and
   the first and second top electrodes are electrically connected to each other; and
   in the second connecting end:
   the third and fourth bottom electrodes are electrically connected to each other;
   the third and fourth intermediate electrodes are electrically isolated from each other; and
   the third and fourth top electrodes are electrically connected to each other.

2. The micro-electromechanical device of claim 1, wherein the first fixed end is located on an opposite side of the second fixed end in a plane parallel to the surface of the substrate with respect to a region in which the first working end faces the second working end.

* * * * *